United States Patent
Lee et al.

(10) Patent No.: US 9,818,781 B2
(45) Date of Patent: Nov. 14, 2017

(54) IMAGE PIXEL INCLUDING A PLURALITY OF TRENCHES, IMAGE SENSOR INCLUDING THE SAME, AND IMAGE PROCESSING SYSTEM INCLUDING THE SAME

(71) Applicant: SAMSUNG ELECTRONICS CO., LTD., Suwon-si, Gyeonggi-Do (KR)

(72) Inventors: Kyung Ho Lee, Suwon-si (KR); Jung Chak Ahn, Yongin-si (KR); Hyuk Soon Choi, Hwaseong-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 122 days.

(21) Appl. No.: 14/816,396

(22) Filed: Aug. 3, 2015

(65) Prior Publication Data

US 2016/0043119 A1 Feb. 11, 2016

(30) Foreign Application Priority Data

Aug. 5, 2014 (KR) ........................ 10-2014-0100230

(51) Int. Cl.
| | | |
|---|---|---|
| H01L 27/14 | (2006.01) |
| H01L 27/146 | (2006.01) |
| H04N 5/369 | (2011.01) |
| H04N 5/3745 | (2011.01) |

(52) U.S. Cl.
CPC ...... *H01L 27/1463* (2013.01); *H01L 27/1464* (2013.01); *H01L 27/14621* (2013.01); *H01L 27/14627* (2013.01); *H01L 27/14641* (2013.01); *H01L 27/14643* (2013.01); *H01L 27/14645* (2013.01); *H01L 27/14689* (2013.01); *H04N 5/3696* (2013.01); *H04N 5/3745* (2013.01)

(58) Field of Classification Search
CPC .................................................. H01L 27/1463
See application file for complete search history.

(56) References Cited

U.S. PATENT DOCUMENTS

| | | | |
|---|---|---|---|
| 8,319,874 B2 | 11/2012 | Suzuki | |
| 8,446,498 B2 | 5/2013 | Ishiwata et al. | |
| 9,288,380 B2 * | 3/2016 | Nomura | ............. H04N 5/23212 |
| 2012/0268634 A1 | 10/2012 | Fukuda et al. | |
| 2013/0083225 A1 | 4/2013 | Minowa et al. | |
| 2013/0083230 A1 | 4/2013 | Fukuda | |
| 2013/0087875 A1 | 4/2013 | Kobayashi et al. | |

FOREIGN PATENT DOCUMENTS

| | | |
|---|---|---|
| JP | 2008-270298 | 11/2008 |
| JP | 2009-158800 | 7/2009 |
| JP | 2001-250931 | 9/2011 |
| JP | 2013-041890 | 2/2013 |
| JP | 2013-152388 | 8/2013 |
| JP | 2013-239787 | 11/2013 |

\* cited by examiner

*Primary Examiner* — Tony Ko
(74) *Attorney, Agent, or Firm* — F. Chau & Associates, LLC

(57) ABSTRACT

An image pixel includes a plurality of photodiodes formed in a semiconductor substrate, and a plurality of trenches. Each photodiode is configured to accumulate a plurality of photocharges corresponding to the intensity of light received at each photodiode through a microlens. The plurality of trenches is configured to electrically isolate the photodiodes from one another.

18 Claims, 24 Drawing Sheets

IMAGE PIXEL INCLUDING A PLURALITY OF TRENCHES, IMAGE SENSOR INCLUDING THE SAME, AND IMAGE PROCESSING SYSTEM INCLUDING THE SAME

CROSS-REFERENCE TO RELATED APPLICATIONS

This application claims priority under 35 U.S.C. §119 to Korean Patent Application No. 10-2014-0100230 filed on Aug. 5, 2014, the disclosure of which is incorporated by reference herein in its entirety.

TECHNICAL FIELD

Exemplary embodiments of the inventive concept relate to an image pixel, an image sensor including the same, and an image processing system including the same, and more particularly, to an image pixel capable of increasing the quality of displayed images by preventing or reducing crosstalk between photodiodes, an image sensor including the same, and an image processing system including the same.

DISCUSSION OF THE RELATED ART

Complementary metal oxide semiconductor (CMOS) image sensors are solid-state sensing devices that use complementary metal oxide semiconductors. CMOS image sensors have lower manufacturing costs compared to charge-coupled device (CCD) image sensors. In addition, CMOS image sensors have a smaller size compared to CCD image sensors having a high-voltage analog circuit, and thus, consume less power. In addition, the performance of CMOS image sensors has been recently improved. As a result, CMOS image sensors are frequently used for various electronic appliances including portable devices such as, for example, smartphones and digital cameras.

A pixel array included in a CMOS image sensor may include a photoelectric conversion element in each pixel. The photoelectric conversion element generates an electrical signal that varies based on the quantity of incident light. The CMOS image sensor processes electrical signals to synthesize an image. With the recent proliferation of high-resolution images, pixels included in the CMOS image sensor are becoming much smaller. When the pixels get smaller, incident light may not be properly sensed or noise may occur due to interference between highly integrated elements.

SUMMARY

According to an exemplary embodiment of the inventive concept, an image pixel includes a plurality of photodiodes formed in a semiconductor substrate. Each photodiode is configured to accumulate a plurality of photocharges corresponding to an intensity of light received at each photodiode through a microlens. The image pixel further includes a plurality of trenches configured to electrically isolate the photodiodes from one another.

In an exemplary embodiment, the image pixel further includes a wiring layer formed on a first surface of the semiconductor substrate. The microlens is disposed on a second surface of the semiconductor substrate that opposes the first surface, and the photodiodes are disposed between the wiring layer and the microlens. An operation is performed on a plurality of pixel signals generated by the photodiodes to obtain information relating to an autofocusing operation.

In an exemplary embodiment, the trenches include a deep trench isolation (DTI) trench formed using a DTI process. The DTI trench is configured to electrically isolate adjacent photodiodes from among the plurality of photodiodes from each other.

In an exemplary embodiment, the DTI trench is formed along an entirety of a vertical length of the semiconductor substrate.

In an exemplary embodiment, the DTI trench is formed along a portion of a vertical length of the semiconductor substrate. The portion of the vertical length is less than an entirety of the vertical length.

In an exemplary embodiment, the DTI trench is formed using a back trench process.

In an exemplary embodiment, the DTI trench is formed using a front trench process.

In an exemplary embodiment, the trenches include a deep trench isolation (DTI) trench formed using a DTI process. The DTI trench is configured to electrically isolate the plurality of photodiodes formed in the image pixel from a photodiode formed in an adjacent image pixel.

In an exemplary embodiment, the DTI trench is formed along an entirety of a vertical length of the semiconductor substrate.

In an exemplary embodiment, the DTI trench is formed along a portion of a vertical length of the semiconductor substrate. The portion of the vertical length is less than an entirety of the vertical length.

In an exemplary embodiment, the DTI trench is formed using a back trench process.

In an exemplary embodiment, the DTI trench is formed using a front trench process.

According to an exemplary embodiment of the inventive concept, an image pixel includes a plurality of photodiodes formed in a semiconductor substrate. Each photodiode is configured to accumulate a plurality of photocharges corresponding to an intensity of light received at each photodiode through a microlens. The photodiodes are electrically isolated from one another by a plurality of trenches. A plurality of pixel signals is generated using the photocharges.

In an exemplary embodiment, the image pixel further includes a wiring layer formed on a first surface of the semiconductor substrate. The microlens is disposed on a second surface of the semiconductor substrate that opposes the first surface, and the photodiodes are disposed between the wiring layer and the microlens. An operation is performed on the pixel signals generated by the photodiodes to obtain information relating to an autofocusing operation.

In an exemplary embodiment, the trenches include a deep trench isolation (DTI) trench formed using a DTI process. The DTI trench is configured to electrically isolate adjacent photodiodes from among the plurality of photodiodes from each other.

In an exemplary embodiment, the DTI trench is formed along an entirety of a vertical length of the semiconductor substrate, or the DTI trench is formed along a portion of the vertical length of the semiconductor substrate that is less than the entirety of the vertical length.

In an exemplary embodiment, the DTI trench is formed using one of a back trench process and a front trench process.

In an exemplary embodiment, the trenches include a deep trench isolation (DTI) trench formed using a DTI process. The DTI trench is configured to electrically isolate the plurality of photodiodes formed in the image pixel from a photodiode formed in an adjacent image pixel.

In an exemplary embodiment, the DTI trench is formed along an entirety of a vertical length of the semiconductor substrate, or the DTI trench is formed along a portion of the vertical length of the semiconductor substrate that is less than the entirety of the vertical length.

In an exemplary embodiment, the DTI trench is formed using one of a back trench process and a front trench process.

According to an exemplary embodiment of the inventive concept, an image sensor includes a pixel array including a plurality of image pixels, a readout block configured to convert a pixel signal of each of the image pixels to a digital pixel signal and to amplify the digital pixel signal, and a control block configured to control the pixel array and the readout block. The image pixel includes a plurality of photodiodes formed in a semiconductor substrate. Each photodiode is configured to accumulate a plurality of photocharges corresponding to an intensity of light received at each photodiode through a microlens. The image pixel further includes a plurality of trenches configured to electrically isolate the photodiodes from one another.

In an exemplary embodiment, the image sensor further includes a wiring layer formed on a first surface of the semiconductor substrate. The microlens is disposed on a second surface of the semiconductor substrate that opposes the first surface, and the photodiodes are disposed between the wiring layer and the microlens. An operation is performed on a plurality of pixel signals generated by the photodiodes to obtain information relating to an autofocusing operation.

In an exemplary embodiment, the trenches include a first deep trench isolation (DTI) trench formed using a DTI process and configured to electrically isolate adjacent photodiodes from among the plurality of photodiodes from each other, and a second DTI trench formed using a DTI process and configured to electrically isolate the plurality of photodiodes formed in the image pixel from a photodiode formed in an adjacent image pixel.

In an exemplary embodiment, each of the first DTI trench and the second DTI trench is formed along an entirety of a vertical length of the semiconductor substrate, or along a portion of the vertical length of the semiconductor substrate that is less than the entirety of the vertical length.

In an exemplary embodiment, each of the first DTI trench and the second DTI trench is formed using one of a back trench process and a front trench process.

According to an exemplary embodiment of the inventive concept, an image processing system includes an image sensor and an image processor. The image sensor includes a pixel array including a plurality of image pixels, a readout block configured to convert a pixel signal of each of the image pixels to a digital pixel signal and to amplify the digital pixel signal, and a control block configured to control the pixel array and the readout block. The image processor is configured to extract information relating to an autofocusing operation from the digital pixel signal. Each of the image pixels includes a plurality of photodiodes, each configured to accumulate a plurality of photocharges corresponding to an intensity of light received at each photodiode through a microlens, and a plurality of trenches configured to electrically isolate the photodiodes from one another.

According to an exemplary embodiment of the inventive concept, an image pixel includes a plurality of photodiodes formed in a semiconductor substrate, a first trench, and a second trench. Each photodiode is configured to accumulate a plurality of photocharges corresponding to an intensity of light received at each photodiode through a microlens. The first trench is configured to electrically isolate adjacent photodiodes from among the plurality of photodiodes from each other. The second trench is configured to electrically isolate the plurality of photodiodes formed in the image pixel from a photodiode formed in an adjacent image pixel.

In an exemplary embodiment, the first trench extends from an uppermost surface of the semiconductor substrate to a lowermost surface of the semiconductor substrate in a vertical direction, the first trench extends from the uppermost surface and does not fully extend to the lowermost surface in the vertical direction, or the first trench extends from the lowermost surface and does not fully extend to the uppermost surface in the vertical direction.

In an exemplary embodiment, the second trench extends from an uppermost surface of the semiconductor substrate to a lowermost surface of the semiconductor substrate in a vertical direction, the second trench extends from the uppermost surface and does not fully extend to the lowermost surface in the vertical direction, or the second trench extends from the lowermost surface and does not fully extend to the uppermost surface in the vertical direction.

In an exemplary embodiment, the first trench and the second trench are each a deep trench isolation (DTI) trench formed using a DTI process.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
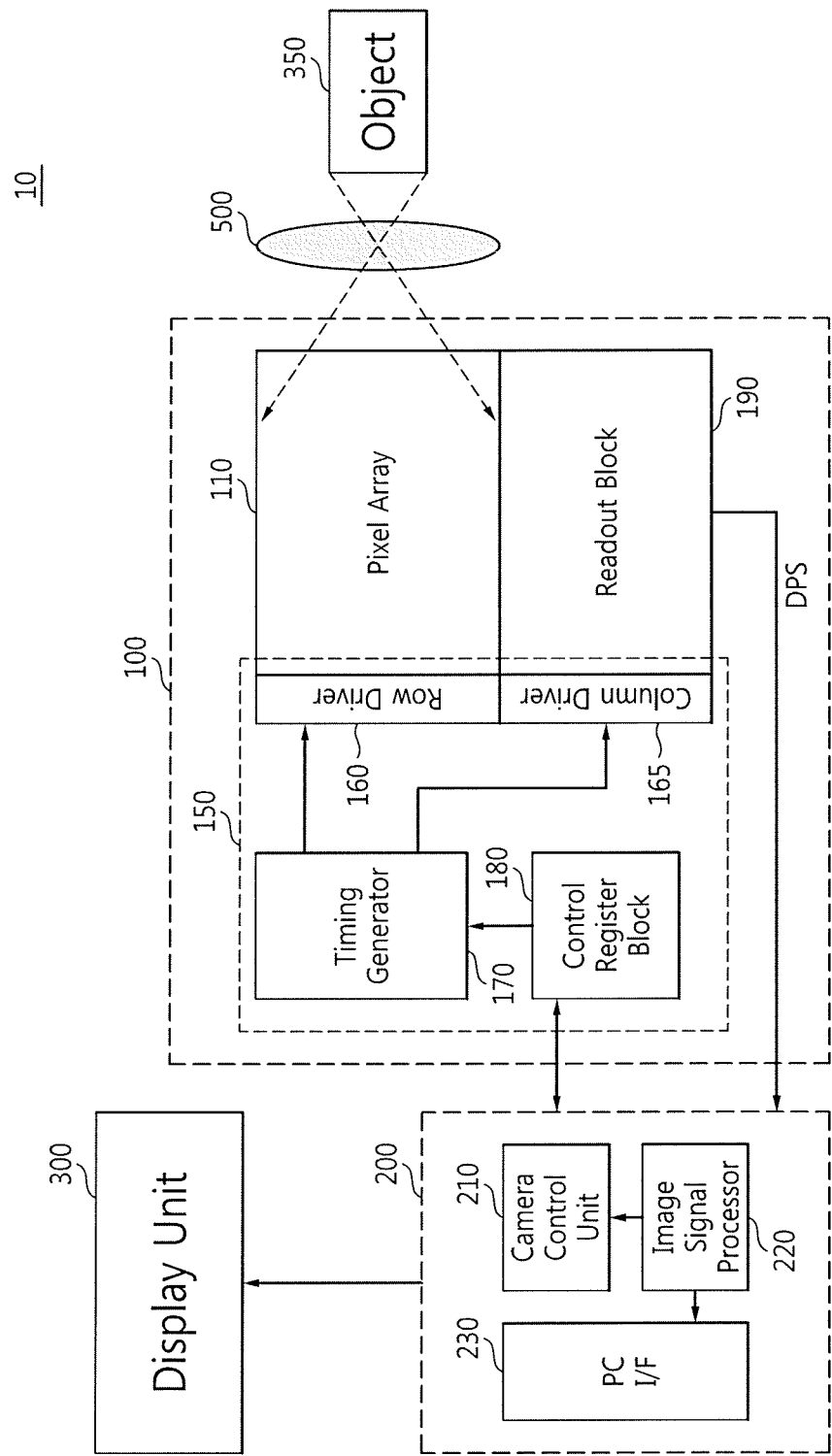
FIG. 1 is a block diagram of an image processing system including an image sensor according to an exemplary embodiment of the inventive concept.

Exemplary embodiments of the inventive concept will be described more fully hereinafter with reference to the accompanying drawings. In the drawings, the size and relative sizes of layers and regions may be exaggerated for clarity. Like reference numerals may refer to like elements throughout.

It will be understood that when an element or layer is referred to as being "connected" or "coupled" to another element or layer, it can be directly connected or coupled to the other element or layer, or intervening elements or layers may be present.

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

As used herein, the singular forms "a", "an" and "the" are intended to include the plural forms as well, unless the context clearly indicates otherwise.

As used herein, when elements or layers are described as being adjacent to one another, the elements or layers may be directly adjacent to one another or intervening elements or layers may be present. Further, when two or more elements or values are described as being substantially the same as or equal to each other, it is to be understood that the elements or values are identical to each other, indistinguishable from each other, or distinguishable from each other but functionally the same as each other as would be understood by a person having ordinary skill in the art.

FIG. 1 is a block diagram of an image processing system 10 including an image sensor 100 according to an exemplary embodiment of the inventive concept. The image processing system 10 may include the image sensor 100, a digital signal processor (DSP) 200, a display unit 300, and a lens 500. The image sensor 100 may include the lens 500, a pixel array 110, a control unit 150, and a readout block 190.

The pixel array 110 may include a plurality of pixels (e.g., pixel 120-1A shown in FIG. 2), each of which accumulates photocharges generated in response to light of an object 350 passing through the lens 500 and generates a pixel signal corresponding to the photocharges. The pixels may be arranged in a matrix of "n" rows and "m" columns, where "n" and "m" are integers of at least 1.

Figure 2:
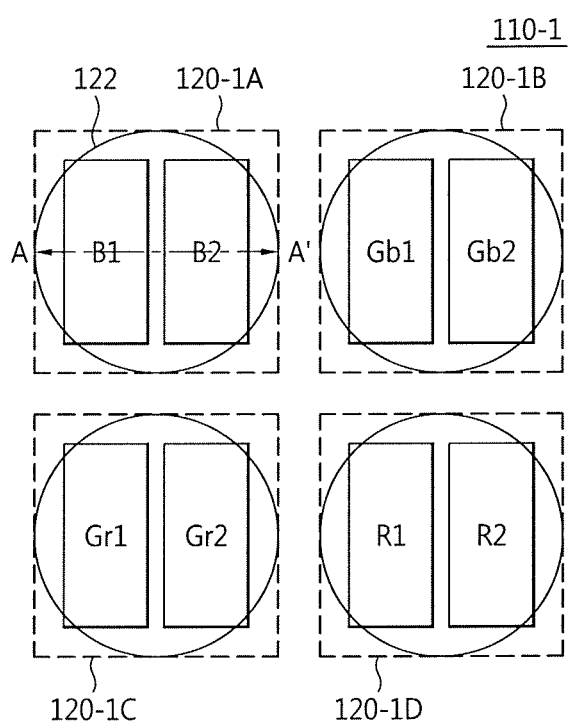
FIG. 2 is a diagram of an example of a pixel array illustrated in FIG. 1 according to an exemplary embodiment of the inventive concept.

Each pixel includes a plurality of transistors and photoelectric conversion elements (e.g., elements B1 and B2 shown in FIG. 2). A photoelectric conversion element may be, for example, a photodiode or a pinned photodiode. The pixel array 110 senses light using a plurality of photoelectric conversion elements and converts the light into electrical signals, thereby generating pixel signals. When a pixel (e.g., pixel 120-1A shown in FIG. 2) includes a plurality of photodiodes (e.g., photodiodes B1 and B2 shown in FIG. 2), a pixel signal may include a plurality of subpixel signals respectively corresponding to the photodiodes. The pixels may be referred to as image pixels in the sense that they generate a signal corresponding to a captured image.

The control unit 150 may generate and provide a plurality of control signals that control the operations of the pixel array 110 and the readout block 190. The control unit 150 may include, for example, a row driver 160, a column driver 165, a timing generator 170, and a control register block 180.

The row driver 160 drives the pixel array 110 in row units. For example, pixels in one row may be provided with the same control signals (e.g., control signals TG1, TG2, RG, and SEL shown in FIG. 5). The row driver 160 may decode a control signal output from the timing generator 170 and provide control signals to the pixel array 110.

The column driver 165 may generate a plurality of control signals according to the control of the timing generator 170, and may control the operation of the readout block 190.

The timing generator 170 may apply a control signal or a clock signal to the row driver 160 and the column driver 165 to control the operations or timing of the row driver 160 and the column driver 165. The timing generator 170 may generate the control signal or the clock signal to be applied to the row driver 160 and the column driver 165 using, for example, a control signal and a clock signal received from an external device (e.g., a host).

The control register block 180 operates according to the control of a camera control unit 210, and may store or buffer the control signal and the clock signal. The control register block 180 may control the operations of the lens 500, the pixel array 110, the control unit 150, and the readout block 190 of the image sensor 100. The control register block 180 may control the distance between the lens 500 and the pixel array 110 according to autofocusing information of an image signal processor (ISP) 220, which will be described further below. The control register block 180 may control the switching operation of the readout block 190 to allow the readout block 190 to obtain the sum of a first subpixel signal and a second subpixel signal, which will be described further below, or the difference between the first and second subpixel signals.

The readout block 190 may remove noise (e.g., reset noise) from a pixel signal generated by each of the pixels, and may perform analog-to-digital conversion on the pixel signal. The readout block 190 may temporarily store and then amplify an analog-to-digital converted digital pixel signal DPS. The readout block 190 may include an analog-to-digital converter (ADC) that removes noise and performs analog-to-digital conversion, memory (e.g., static random access memory (SRAM)) that temporarily stores the digital pixel signal DPS, and a buffer that amplifies and outputs the digital pixel signal DPS. The ADC may perform an operation (e.g., an addition or subtraction operation) on subpixel signals included in a pixel signal.

The DSP 200 may generate image data by processing the digital pixel signal DPS output from the image sensor 100, and may output the image data to the display unit 300. The DSP 200 may include the camera control unit 210, the ISP 220, and a personal computer interface (PC I/F) 230.

The camera control unit 210 controls the control register block 180. The camera control unit 210 may control the control register block 180 using, for example, an inter-integrated circuit (I²C). However, exemplary embodiments of the inventive concept are not limited thereto.

The ISP 220 processes the digital pixel signal DPS output from the readout block 190 to convert the digital pixel signal DPS to image data viewable to a user, and outputs the image data to the display unit 300 through the PC I/F 230. The ISP 220 may perform an operation (e.g., an addition or subtraction operation) on portions of the digital pixel signal DPS respectively corresponding to subpixel signals included in a single pixel signal. According to exemplary embodiments, the ISP 220 may be implemented in a chip separate from the image sensor 100, or the ISP 220 and the image sensor 100 may be integrated into a single chip.

The display unit 300 may be any device capable of outputting an image using image data output from the DSP 200. For example, the display unit 300 may be implemented as a computer, a mobile phone, a smartphone, or any type of image output terminal.

Figure 3:
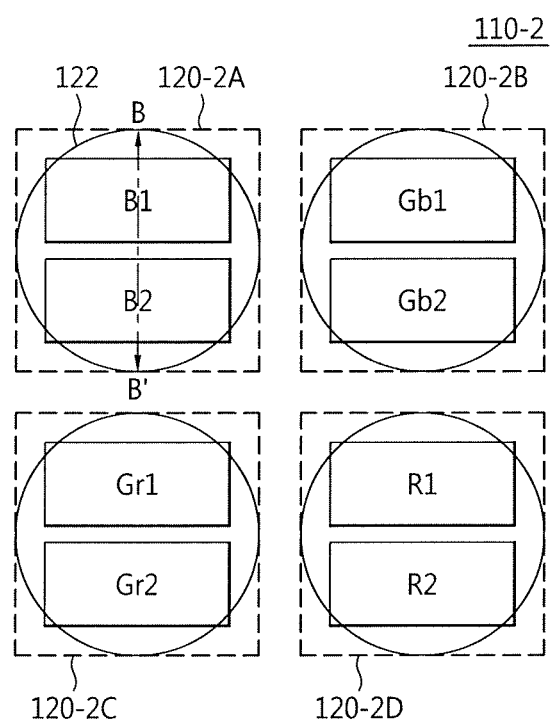
FIG. 3 is a diagram of an example of the pixel array illustrated in FIG. 1 according to an exemplary embodiment of the inventive concept.
Figure 4:
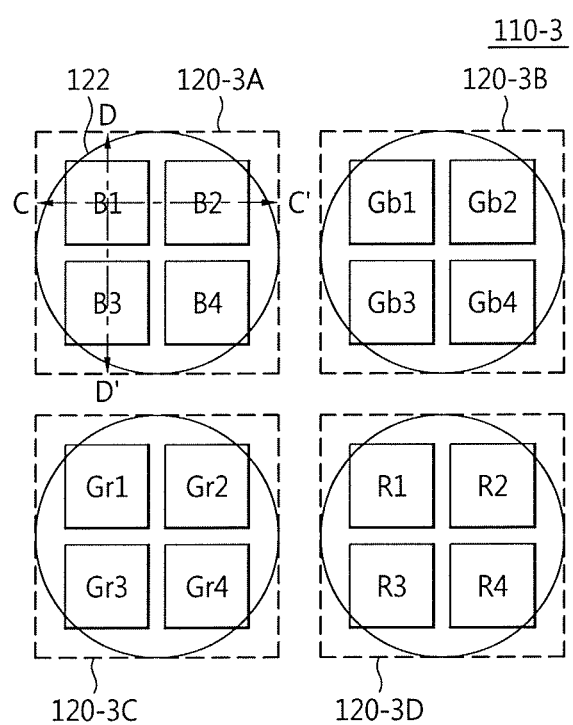
FIG. 4 is a diagram of an example of the pixel array illustrated in FIG. 1 according to an exemplary embodiment of the inventive concept.

FIG. 2 is a diagram of an example 110-1 of the pixel array 110 illustrated in FIG. 1 according to an exemplary embodiment of the inventive concept. FIG. 3 is a diagram of another example 110-2 of the pixel array 110 illustrated in FIG. 1 according to an exemplary embodiment of the inventive concept. FIG. 4 is a diagram of another example 110-3 of the pixel array 110 illustrated in FIG. 1 according to an exemplary embodiment of the inventive concept. Referring to FIGS. 1 through 4, for convenience of explanation, only part of the pixel array 110, for example, four pixels (e.g., pixels 120-1A through 120-1D in FIG. 2, pixels 120-2A through 120-2D in FIG. 3, and pixels 120-3A through 120-3D in FIG. 4) are illustrated in FIGS. 2 through 4. However, it is to be understood that pixels having substantially the same structure as these four pixels may be arranged in an area other than the four pixels according to exemplary embodiments.

The pixel array 110-1 illustrated in FIG. 2 may include first through fourth pixels 120-1A through 120-1D arranged in a bayer pattern. For example, in an exemplary embodiment, the first pixel 120-1A may be a blue pixel including a blue filter, the second pixel 120-1B may be a green-on-blue pixel including a green filter, the third pixel 120-1 C may be a green-on-red pixel including a green filter, and the fourth pixel 120-1D may be a red pixel including a red filter.

Each of the first through fourth pixels 120-1A through 120-1D may have a microlens 122 having an area corresponding to each pixel. Each of the first through fourth pixels 120-1A through 120-1D may include two photodiodes B1 and B2, Gb1 and Gb2, Gr1 and Gr2, or R1 and R2, respectively. Two photodiodes (e.g., photodiodes B1 and B2) may be arranged in a row direction (e.g., a direction substantially parallel to the line A-A') and may extend (e.g., may be elongated) in a column direction (e.g., in a direction substantially perpendicular to the line A-A') in a pixel (e.g., pixel 120-1A). The structure and operations are substantially the same among the first through fourth pixels 120-1A through 120-1D except for the different color filters. Thus, for convenience of explanation, only the first pixel 120-1A will be described in detail herein.

The first pixel 120-1 A includes the first photodiode B1 and the second photodiode B2. The first pixel 120-1A may generate a pixel signal including a first subpixel signal corresponding to photocharges accumulated at the first photodiode B1, and a second subpixel signal corresponding to photocharges accumulated at the second photodiode B2.

When the sum of the first and second subpixel signals is detected, data (e.g., two-dimensional (2D) image information) corresponding to a pixel signal generated by a pixel including a signal photodiode unlike the first pixel 120-1A may be obtained in the ISP 220. When the difference between the first and second subpixel signals is detected, autofocusing information corresponding to the position of the first pixel 120-1A and depth information may be obtained in the ISP 220.

The autofocusing information indicates whether a position corresponding to the first pixel 120-1A in a current image is correctly focused, as well as how much, if at all, it is out of focus. For example, when a user focuses on the position corresponding to the first pixel 120-1A and the autofocusing information indicates that the position corresponding to the first pixel 120-1A is out of focus, the camera control unit 210 may transmit lens control information to the control register block 180 based on the autofocusing information. The control register block 180 may control the distance between the lens 500 and the pixel array 110 according to the lens control information. An operation of controlling the distance between the lens 500 and the pixel array 110 using the autofocusing information may be referred to as an autofocusing operation.

The depth information indicates the distance between the pixel array 110 and the object 350 at the position corresponding to the first pixel 120-1A in the current image. Accordingly, the ISP 220 may generate three-dimensional (3D) image data by combining the depth information and the 2D information.

The first and second subpixel signals are generated when photocharges generated from light coming through one microlens 122 and collected at physically different places are accumulated at different photodiodes. Accordingly, the difference between the first and second subpixel signals includes information indicating a phase difference therebetween, and the autofocusing information and the depth information may be obtained using the information indicating the phase difference.

The pixel array 110-2 illustrated in FIG. 3 may include first through fourth pixels 120-2A through 120-2D arranged in a bayer pattern. The pixel array 110-2 is substantially the same as the pixel array 110-1 illustrated in FIG. 2, except for the differences described below. For convenience of explanation, only the differences will be described.

Each of the first through fourth pixels 120-2A through 120-2D may respectively include two photodiodes B1 and B2, Gb1 and Gb2, Gr1 and Gr2, and R1 and R2. Two photodiodes (e.g., photodiodes B1 and B2) may be arranged in the column direction (e.g., a direction substantially parallel to the line B-B') and may extend in (e.g., may be elongated in) the row direction (e.g., a direction substantially perpendicular to the line B-B') in a pixel (e.g., pixel 120-2A).

The pixel array 110-2 is the same as the pixel array 110-1 illustrated in FIG. 2 in regards that it may obtain 2D image information, autofocusing information, and depth information from subpixel signals generated by each pixel. However, the arrangement including the direction and shape of two photodiodes included in each pixel are different from those in each pixel included in the pixel array 110-1 illustrated in FIG. 2. As a result, 2D image information, autofocusing information, and depth information generated by each pixel illustrated in FIG. 3 may be different from those in the pixel array 110-1 illustrated in FIG. 2.

The pixel array 110-3 illustrated in FIG. 4 may include first through fourth pixels 120-3A through 120-3D arranged in a bayer pattern. The pixel array 110-3 is substantially the same as the pixel array 110-1 illustrated in FIG. 2 except for the differences described below. For convenience of explanation, only the differences will be described.

Each of the first through fourth pixels 120-3A through 120-3D may respectively include four photodiodes B1 through B4, Gb1 through Gb4, Gr1 through Gr4, and R1 through R4. Four photodiodes (e.g., photodiodes B1 through B4) may be arranged in a matrix formation in each pixel (e.g., pixel 120-3A), and each of the photodiodes (e.g., photodiodes B1 through B4) may have the same shape as the pixel (e.g., pixel 120-3A).

Since each of the first through fourth pixels 120-3A through 120-3D respectively includes four photodiodes B1 through B4, Gb1 through Gb4, Gr1 through Gr4, and R1 through R4, each pixel may generate first through fourth subpixel signals. The first through fourth subpixel signals are generated when photocharges generated from light coming through one microlens 122 and collected at physically different places are accumulated at four different photodiodes (e.g., photodiodes B1 through B4) in each pixel (e.g., pixel 120-3A). In exemplary embodiments, the first through fourth subpixel signals are generated from photocharges accumulated at the first through fourth photodiodes B1 through B4, respectively.

A result of adding the first and second subpixel signals may be the same or almost the same as a signal generated from photocharges accumulated at the first photodiode B1 of the first pixel 120-1 A illustrated in FIG. 2. Further, a result of adding the third and fourth subpixel signals may be the same or almost the same as a signal generated from photocharges accumulated at the second photodiode B2 of the first pixel 120-1A illustrated in FIG. 2. Accordingly, 2D image information, autofocusing information, and depth information, which may be obtained in the first pixel 120-1A illustrated in FIG. 2, may be obtained using the two addition results.

Similarly, a result of adding the first and third subpixel signals may be the same or almost the same as a signal generated from photocharges accumulated at the first photodiode B1 of the first pixel 120-2A illustrated in FIG. 3. Further, a result of adding the second and fourth subpixel signals may be the same or almost the same as a signal generated from photocharges accumulated at the second photodiode B2 of the first pixel 120-2A illustrated in FIG. 3. Accordingly, 2D image information, autofocusing information, and depth information which may be obtained in the first pixel 120-2A illustrated in FIG. 3, may be obtained using the two addition results.

When the first through fourth subpixel signals obtained in the first pixel 120-3A are subjected to two different methods of addition, 2D image information, autofocusing information, and depth information may be different between the first pixels 120-1A and 120-2A illustrated in FIGS. 2 and 3, respectively, as described above with reference to FIG. 3, and the ISP 220 may compensate for the difference.

Each pixel illustrated in FIGS. 2 through 4 includes at least two photodiodes, and autofocusing information is extracted from a signal output from each pixel. Accordingly, each pixel may be referred to as an autofocusing pixel.

The addition and subtraction between subpixel signals described with reference to FIGS. 2 through 4 may be performed at an analog level or a digital level. For example, the addition and subtraction at the analog level may be carried out by the operation of a plurality of capacitors and switches in the readout block 190 connected to a column line (e.g., COL in FIG. 5) connected to a pixel (e.g., pixel 120-1A). The addition and subtraction at the digital level may be carried out by the readout block 190 or the ISP 220 which receives the subpixel signals that have been subjected to analog-to-digital conversion.

Figure 5:
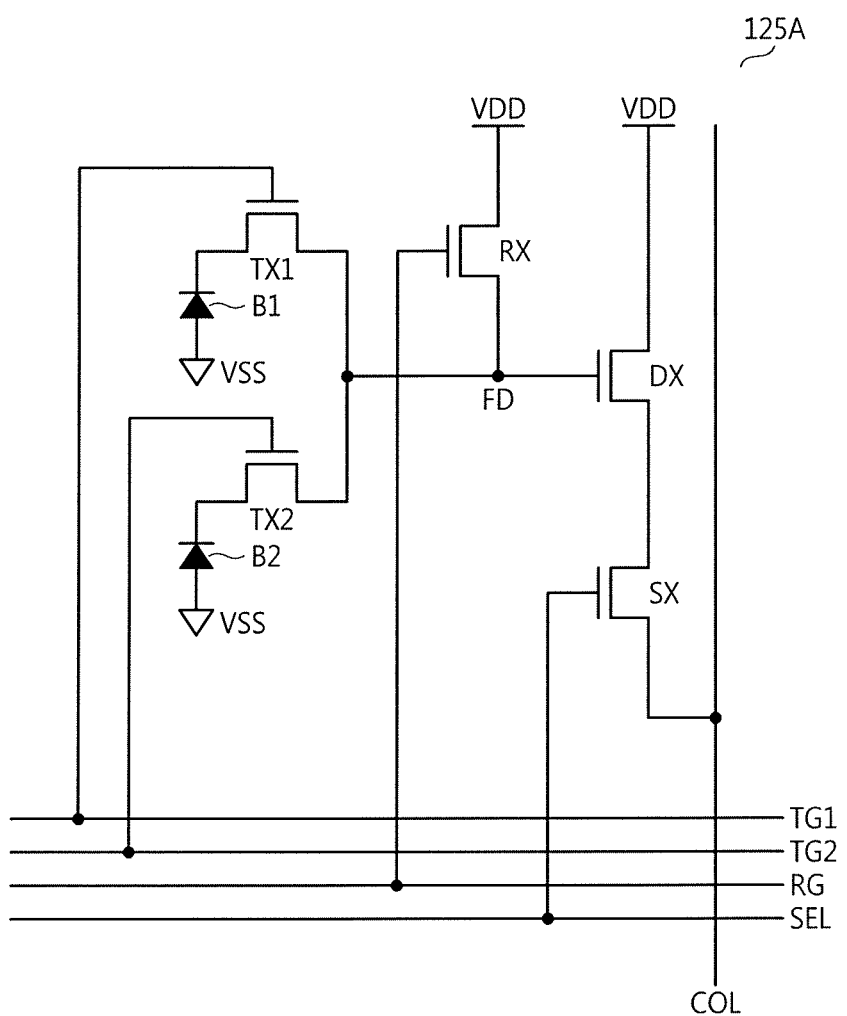
FIG. 5 is a diagram of an example of the pixels illustrated in FIGS. 2 and 3 according to an exemplary embodiment of the inventive concept.
Figure 6:
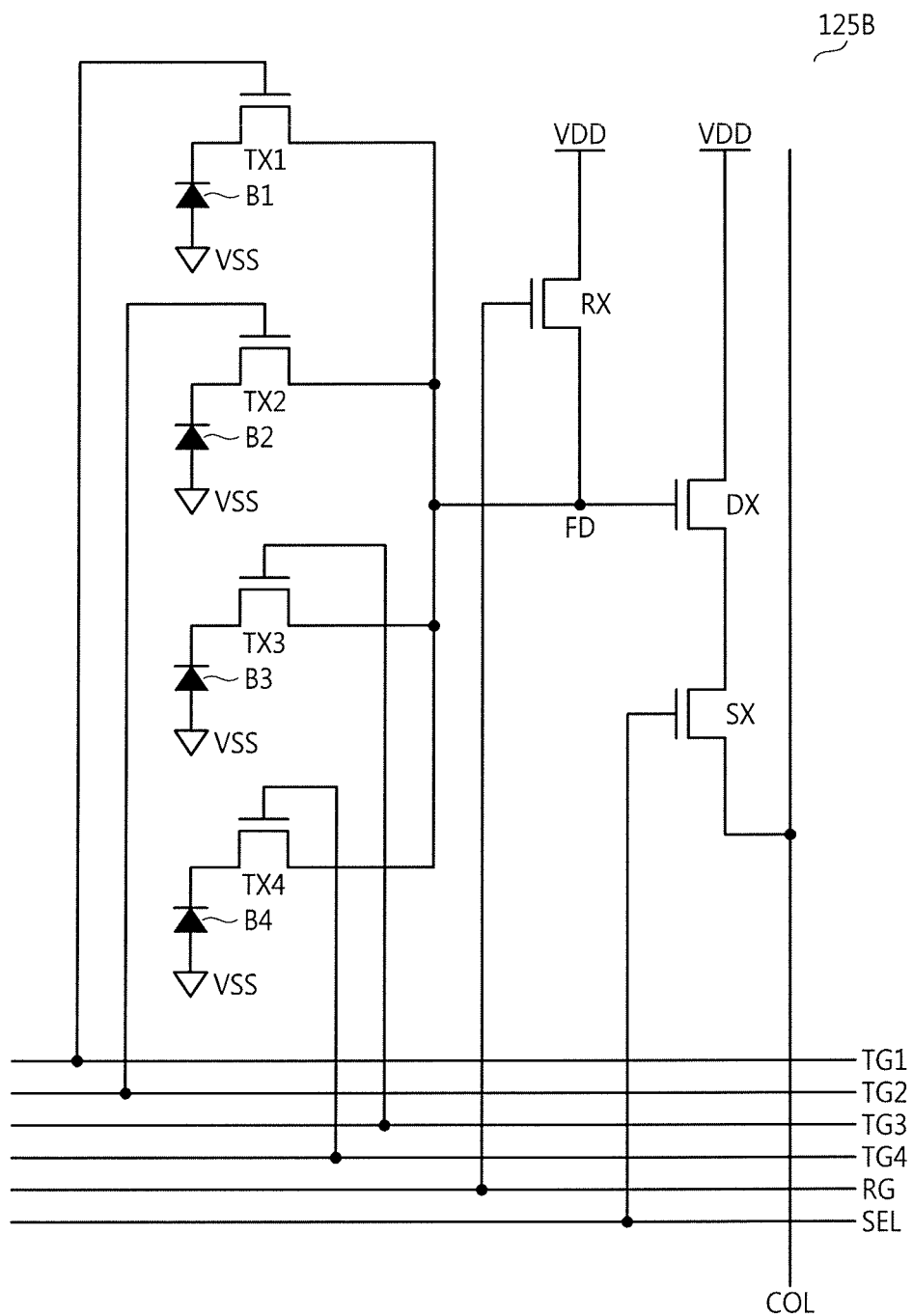
FIG. 6 is a diagram of an example of the pixels illustrated in FIG. 4 according to an exemplary embodiment of the inventive concept.

FIG. 5 is a diagram of an example 125A of the pixels illustrated in FIGS. 2 and 3 according to an exemplary embodiment of the inventive concept. FIG. 6 is a diagram of an example 125B of the pixels illustrated in FIG. 4 according to an exemplary embodiment of the inventive concept. Referring to FIGS. 1 through 5, the structure and operations are substantially the same among the first through fourth pixels 120-1A through 120-1D illustrated in FIG. 2 and the first through fourth pixels 120-2A through 120-2D illustrated in FIG. 3 in terms of the circuit configuration. Thus, for convenience of explanation, only the first pixel 120-1A/120-2A will be described.

The pixel 125A is an equivalent circuit of the first pixel 120-1A/120-2A, and may include the first photodiode B1, the second photodiode B2, a first transfer transistor TX1, a second transfer transistor TX2, a floating diffusion node FD, a reset transistor RX, a drive transistor DX, and a selection transistor SX. Together, the first transfer transistor TX1, the second transfer transistor TX2, the floating diffusion node FD, the reset transistor RX, the drive transistor DX, and the selection transistor SX may form a signal generation unit.

Although a pixel structure including four kinds of complementary metal oxide semiconductor (CMOS) transistors TX, RX, DX, and SX is illustrated in FIG. 5, exemplary embodiments of the inventive concept are not limited thereto. For example, any circuits including at least three types of transistors can be used in exemplary embodiments of the inventive concept.

The floating diffusion node FD, the reset transistor RX, the drive transistor DX, and the selection transistor SX are shared by the first and second transfer transistors TX1 and TX2 in the exemplary embodiment illustrated in FIG. 5, however, according to exemplary embodiments, each of the first and second transfer transistors TX1 and TX2 may be connected to a different floating diffusion node, reset transistor, drive transistor and/or selection transistor.

The first and second photodiodes B1 and B2 are examples of a photoelectric conversion element. Each of the first and second photodiodes B1 and B2 may include, for example, at least one of a phototransistor, a photogate, a pinned photodiode (PPD), and a combination thereof.

A first transfer control signal TG1, a second transfer control signal TG2, a reset control signal RG, and a selection control signal SEL may be control signals output from the row driver 160. Pixels in one row in the pixel array 110 may receive the first transfer control signal TG1, the second transfer control signal TG2, the reset control signal RG, and the selection control signal SEL at substantially the same timings.

In the operation of the pixel 125A, the first and second photodiodes B1 and B2 generate photocharges corresponding to the intensity of light coming from the object 350 and received at the photodiodes B1 and B2 through the microlens 122. A first end of the first photodiode B1 is connected to the first transfer transistor TX1 and a first end of the second photodiode B2 is connected to the second transfer transistor TX2. Second ends of the respective first and second photodiodes B1 and B2 are connected to a ground voltage VSS. The ground voltage VSS may be, for example, 0 V.

The first transfer transistor TX1 and the second transfer transistor TX2 may transfer the photocharges to the floating diffusion node FD in response to the first transfer control signal TG1 and the second transfer control signal TG2, respectively. The drive transistor DX may amplify and transfer the photocharges to the selection transistor SX according to a potential due to photocharges accumulated at the floating diffusion node FD.

A drain terminal of the selection transistor SX is connected to a source terminal of the drive transistor DX. The selection transistor SX may output a pixel signal to the column line COL connected to the pixel 125A in response to the selection control signal SEL.

The reset transistor RX may reset the floating diffusion node FD to a power supply voltage VDD in response to the reset control signal RG. The power supply voltage VDD refers to a driving voltage of the pixel array 110 and may be in the range of about 2 V to about 5 V.

Referring to the timing of the operation of the pixel 125A, after the floating diffusion node FD is reset by the reset transistor RX, an electrical signal corresponding to a reset state is output to the column line COL by the operations of the drive transistor DX and the selection transistor SX. Thereafter, the first transfer transistor TX 1 transfers photocharges accumulated at the first photodiode B1 to the floating diffusion node FD, and an electrical signal corresponding to the photocharges at the first photodiode B1 is output to the column line COL by the operations of the drive transistor DX and the selection transistor SX.

Thereafter, the floating diffusion node FD is reset by the reset transistor RX, and then an electrical signal corresponding to the reset state is output to the column line COL by the operations of the drive transistor DX and the selection transistor SX. Alternatively, in an exemplary embodiment, the reset operation may be omitted when the readout block 190 stores an electrical signal corresponding to the reset state.

Thereafter, the second transfer transistor TX2 transfers photocharges accumulated at the second photodiode B2 to the floating diffusion node FD, and an electrical signal corresponding to the photocharges at the second photodiode B2 is output to the column line COL by the operations of the drive transistor DX and the selection transistor SX. The readout block 190 may remove the reset noise described above with reference to FIG. 1 by subtracting the electrical signal corresponding to the reset state from the electrical signal corresponding to the photocharges at the first photodiode B1 and from the electrical signal corresponding to the photocharges at the second photodiode B2. The electrical signal having the reset noise removed corresponding to the photocharges at the first photodiode B1 and the electrical signal having the reset noise removed corresponding to the photocharges at the second photodiode B2 may correspond to the first subpixel signal and the second subpixel signal, respectively, as described above with reference to FIGS. 2 and 3.

Referring to FIGS. 4 and 6, the structure and operations are substantially the same among the first through fourth pixels 120-3A through 120-3D illustrated in FIG. 4 in terms of the circuit configuration. Thus, for convenience of explanation, only the first pixel 120-3A will be described.

The pixel 125B is an equivalent circuit of the first pixel 120-3A and may include the first through fourth photodiodes B1 through B4, first through fourth transfer transistors TX1 through TX4, the floating diffusion node FD, the reset transistor RX, the drive transistor DX, and the selection transistor SX. Although a pixel structure including four kinds of CMOS transistors TX, RX, DX, and SX is illustrated in FIG. 6, exemplary embodiments of the inventive concept are not limited thereto. For example, any circuits including at least three types of transistors can be used in exemplary embodiments of the inventive concept.

The floating diffusion node FD, the reset transistor RX, the drive transistor DX, and the selection transistor SX are shared by the first through fourth transfer transistors TX1 through TX4 in the exemplary embodiment illustrated in FIG. 6, however, according to exemplary embodiments, each of the first through fourth transfer transistors TX1 through TX4 may be connected to a different floating diffusion node, reset transistor, drive transistor and/or selection transistor.

The first through fourth photodiodes B1 through B4 are examples of a photoelectric conversion element. Each of the first through fourth photodiodes B1 through B4 may include, for example, at least one of a phototransistor, a photogate, a PPD, and a combination thereof.

First through fourth transfer control signals TG1 through TG4, the reset control signal RG, and the selection control signal SEL may be control signals output from the row driver 160. Pixels in one row in the pixel array 110 may receive the first through fourth transfer control signals TG1 through TG4, the second transfer control signal TG2, the reset control signal RG, and the selection control signal SEL at substantially the same timings.

In the operation of the pixel 125B, the operations of the first through fourth photodiodes B1 through B4, the first through fourth transfer transistors TX 1 through TX4, the reset transistor RX, the drive transistor DX, and the selection transistor SX illustrated in FIG. 6 are substantially the same as those of the first of second photodiodes B1 or B2, the first or second transfer transistor TX1 or TX2, the reset transistor RX, the drive transistor DX, and the selection transistor SX illustrated in FIG. 5.

Referring to the timing of the operation of the pixel 125B, an operation of resetting the floating diffusion node FD and an operation of transferring photocharges from each of the photodiodes B1 through B4 to the floating diffusion node FD may be alternately performed. When photocharges are transferred from one of the photodiodes B1 through B4 to the floating diffusion node FD, an electrical signal corresponding to a potential at the floating diffusion node FD may be output through the column line COL. In addition, when the floating diffusion node FD is reset, an electrical signal corresponding to a potential at the floating diffusion node FD may be output. Alternatively, in an exemplary embodiment, the electrical signal may be output through the column line COL only once.

The readout block 190 may remove the reset noise described above with reference to FIG. 1 by subtracting the electrical signal corresponding to the reset state from each of the electrical signals corresponding to the photocharges at the first through fourth photodiodes B1 through B4, respectively. The electrical signals having the removed reset noise corresponding to the photocharges at the first through fourth photodiodes B1 through B4, respectively, may correspond to the first through fourth subpixel signals, respectively, as described above with reference to FIG. 4.

FIGS. 7 through 21 are diagrams of cross-sections of the first pixels 120-1A, 120-2A, and 120-3A illustrated in FIGS. 2 through 4 according to exemplary embodiments of the inventive concept. Referring to FIGS. 1 through 21, FIG. 7 shows a cross-section of a pixel 400-1 taken vertically along the line A-A' in FIG. 2, the line B-B' in FIG. 3, or the line C-C' in FIG. 4 according to exemplary embodiments of the inventive concept. Since a cross-section taken vertically along the line C-C' in FIG. 4 is substantially the same as that taken vertically along the line D-D' in FIG. 4 except for the difference between the second photodiode B2 and the third photodiode B3, only the cross-section taken vertically along the line C-C' in FIG. 4 will be described with reference to FIGS. 7 through 21.

The pixel 400-1 may include an incidence layer 410, a semiconductor substrate 450-1, and a wiring layer 470. The incidence layer 410 may include, for example, a microlens 412, a first flat layer 414, a color filter 416, and a second flat layer 418.

The microlens 412 may be formed at a top portion of the pixel 400-1. The top portion corresponds to a position at which incident light arrives at the pixel 400-1. The microlens 412 may be used to increase the light gathering ability of the pixel 400-1, and thus, may increase image quality. The microlens 412 may be the microlens 122 illustrated in FIGS. 2 through 4. The wiring layer 470 may be formed on a first surface (e.g., a bottom surface) of the semiconductor substrate 450-1, the microlens 412 may be formed on a second surface (e.g., a top surface) of the semiconductor substrate 450-1 that opposes the first surface, and the photodiodes B1 and B2 may be disposed between the first and second surfaces.

Figure 7:
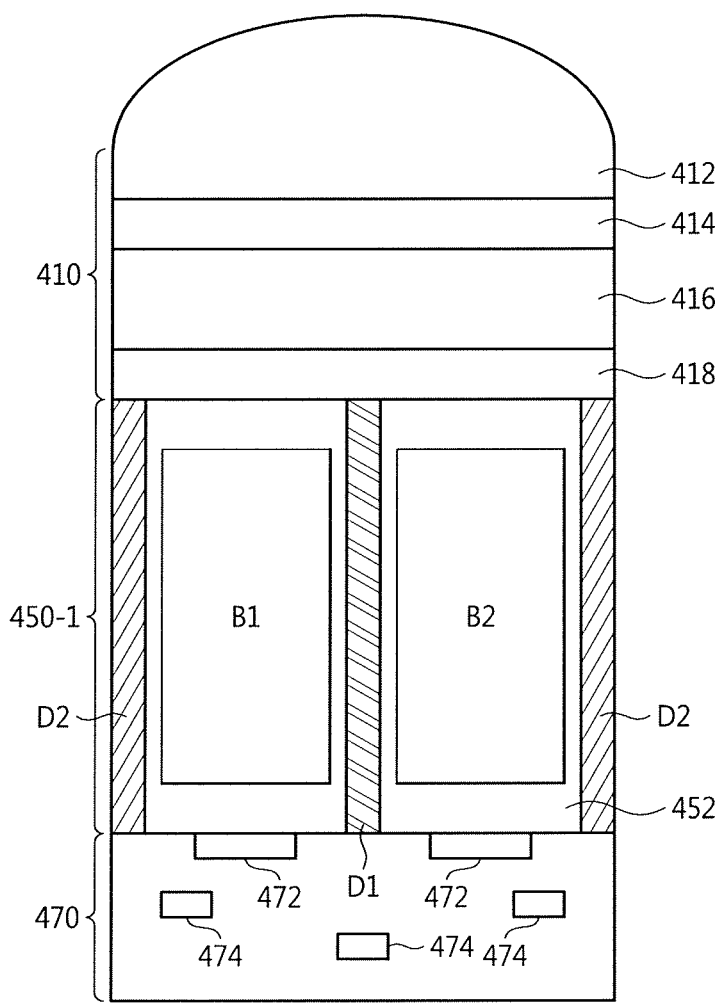
FIGS. 7 through 21 are diagrams of cross-sections of a first pixel illustrated in FIGS. 2 through 4 according to exemplary embodiments of the inventive concept.

The color filter 416 may be formed below the microlens 412. The color filter 416 may selectively transmit light having a predetermined wavelength (e.g., red, green, blue magenta, yellow, or cyan). Since the cross-section illustrated in FIG. 7 is taken along the line A-A' in FIG. 2, the line B-B' in FIG. 3, or the line C-C' in FIG. 4, the color filter 416 corresponds to a blue filter selectively transmitting light with blue wavelengths.

The first flat layer 414 and the second flat layer 418 may be respectively formed above and below the color filter 416. The first flat layer 414 and the second flat layer 418 may prevent light coming through the microlens 412 and the color filter 416 from being reflected. For example, the first flat layer 414 and the second flat layer 418 allow for incident light to be efficiently transmitted, thereby increasing performance aspects such as, for example, absorptance and photosensitivity, of the image sensor 100.

The semiconductor substrate 450-1 may include the first photodiode B1, the second photodiode B2, a P-well 452, a first trench D1, and a second trench D2. The first and second photodiodes B1 and B2 may store photocharges generated according to the intensity of light coming through the microlens 412.

In an exemplary embodiment, the first and second photodiodes B1 and B2 may be formed as n-type regions within the P-well 452 through an ion-implantation process. Each of the first and second photodiodes B1 and B2 may be formed in a structure in which a plurality of doped regions are stacked. The top toped region may be formed using n+-type ion implantation and the bottom doped region may be formed using n--type ion implantation. The first and second photodiodes B1 and B2 may be formed across most of the area of the pixel 400-1 except for the trenches D1 and D2, resulting in a high fill factor. The fill factor may be defined by a ratio of a light receiving area to a pixel area. A higher fill factor results in a higher light absorptance.

The P-well 452 may be formed to surround the first and second photodiodes B1 and B2. The P-well 452 may electrically insulate the first and second photodiodes B1 and B2 from surrounding elements of the photodiodes B1 and B2 such as, for example, the wiring layer 470, the second flat layer 418, and the trenches D1 and D2. A highly n++ doped region adjacent to a gate 472 of each of the transistors TX1 through TX4, RX, DX, and SX in the P-well 452 may operate as source and drain terminals of the transistors TX1 through TX4, RX, DX, and SX.

The first and second trenches D1 and D2 may be formed using, for example, a trench process. The trench process is a process of forming a trench in the semiconductor substrate 450-1 to a certain depth. The trench process may refer to a deep trench isolation (DTI) process providing a relatively deep trench, and a shallow trench isolation (STI) process providing a relatively shallow trench. Each of the first and second trenches D1 and D2 may be a DTI trench formed using the DTI process or an STI trench formed using the STI process.

The first trench D1 may electrically isolate adjacent photodiodes (e.g., B1 and B2 or B1 and B3) from each other. The second trench D2 may electrically isolate a photodiode (e.g., B2) in the first pixel 120-1A, 120-2A, or 120-3A from a photodiode (e.g., Gb1) in a pixel (e.g., 120-1B, 120-2B, or 120-3B) adjacent to the first pixel 120-1A, 120-2A, or 120-3A.

The first and second trenches D1 and D2 may prevent electrical crosstalk and optical crosstalk from occurring between adjacent photodiodes (e.g., B1 and B2) in a current pixel, or between a photodiode in a current pixel and a photodiode (e.g., Gb1) in an adjacent pixel. The electrical crosstalk is a phenomenon in which a signal-to-noise ratio (SNR) decreases due to the exchange of carriers among adjacent photodiodes (e.g., B1, B2 and Gb1). The optical crosstalk is a phenomenon in which an SNR decreases because light incident on the inside of the semiconductor substrate 450-1 (e.g., at a portion between the first trench D1 and the second trench D2 on the right) penetrates an adjacent region (e.g., at a portion between the first trench D1 and the second trench D2 on the left).

The first and second trenches D1 and D2 may be filled with an oxide such as, for example, hafnium oxide and/or polysilicon. For example, the sidewalls of the first and second trenches D1 and D2 may be formed of a polysilicon film doped with boron having a high reflectance. However, exemplary embodiments of the inventive concept are not limited thereto.

As shown in FIG. 7, in an exemplary embodiment, the first and second trenches D1 and D2 may be formed along the full vertical length of the semiconductor substrate 450-1. For example, in an exemplary embodiment, the first and second trenches D1 and D2 may be formed along the entirety of the vertical length of the semiconductor substrate 450-1. Herein, when a trench is described as being formed along the entirety of the vertical length of a semiconductor substrate, it is to be understood that the trench is formed to extend from an uppermost surface of the semiconductor substrate in the vertical direction to a lowermost surface of the semiconductor substrate in the vertical direction. Further, when a trench is described as being formed along a portion of the vertical length of a semiconductor substrate rather than along the entirety of the vertical length, it is to be understood that the trench extends from the uppermost surface of the semiconductor substrate and does not fully extend to the lowermost surface of the semiconductor substrate in the vertical direction, or that the trench extends from the lowermost surface of the semiconductor substrate and does not fully extend to the uppermost surface of the semiconductor substrate in the vertical direction. The first and second trenches D1 and D2 may be formed, for example, using a back trench process in which a trench is formed starting from the side of the incidence layer 410, or using a front trench process in which a trench is formed starting from the side of the wiring layer 470.

The semiconductor substrate 450-1 may further include a floating diffusion node and a ground terminal.

The wiring layer 470 may include the gate 472 of each of the transistors TX1 through TX4, RX, DX, and SX, and multi-layer conductive lines 474. In an exemplary embodiment, the gate 472 may receive a control signal (e.g., RG), as described above with reference to FIGS. 5 and 6. In an exemplary embodiment, the gate 472 may be connected to the floating diffusion node FD. A gate insulation layer may be formed between the gate 472 and the semiconductor substrate 450-1.

The gate insulation layer may be formed of, for example, $SiO_2$, SiON, SiN, $Al_2O_3$, $Si_3N_4$, $Ge_xO_yN_z$, $Ge_xSi_yO_z$, or a high-dielectric material. The high-dielectric material may be formed by performing atomic layer deposition using, for example, $HfO_2$, $ZrO_2$, $Al_2O_3$, $Ta_2O_5$, hafnium silicate, zirconium silicate, or a combination thereof.

The multi-layer conductive lines 474 may transmit signals to the transistors TX1 through TX4, RX, DX, and SX, or may transmit a signal between the pixel 400-1 and an element(s) outside of the pixel 400-1. The multi-layer conductive lines 474 may be formed by patterning a conductive material including metal such as, for example, copper or aluminum.

Figure 8:
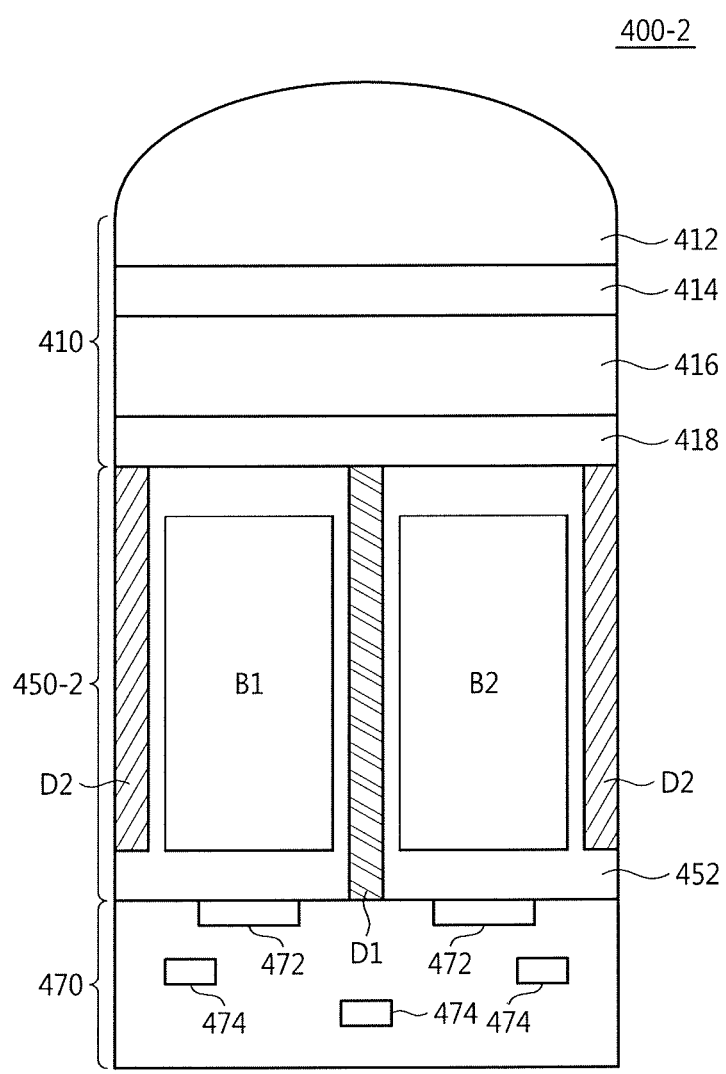

FIG. 8 shows a cross-section of a pixel 400-2 taken vertically along the line A-A' in FIG. 2, the line B-B' in FIG. 3, or the line C-C' in FIG. 4 according to an exemplary embodiment of the inventive concept. For convenience of explanation, only differences from the pixel 400-1 illustrated in FIG. 7 will be described herein.

The second trench D2 included in the pixel 400-2 may be formed along a portion of the full vertical length of a semiconductor substrate 450-2. For example, in an exemplary embodiment, the second trench D2 may be formed along a portion of the vertical length of a semiconductor substrate 450-2 rather than being formed along the entirety of the vertical length of the semiconductor substrate 450-2. When the second trench D2 is formed along a portion of the full vertical length of the semiconductor substrate 450-2, a ratio of the vertical length of the second trench D2 to the vertical length of the semiconductor substrate 450-2 is greater than 0 (e.g., a case in which the second trench D2 does not exist) and less than 1 (e.g., a case in which the vertical length of the second trench D2 is substantially the same as the vertical length of the semiconductor substrate 450-2). The second trench D2 may be formed using, for example, the back trench process.

Figure 9:
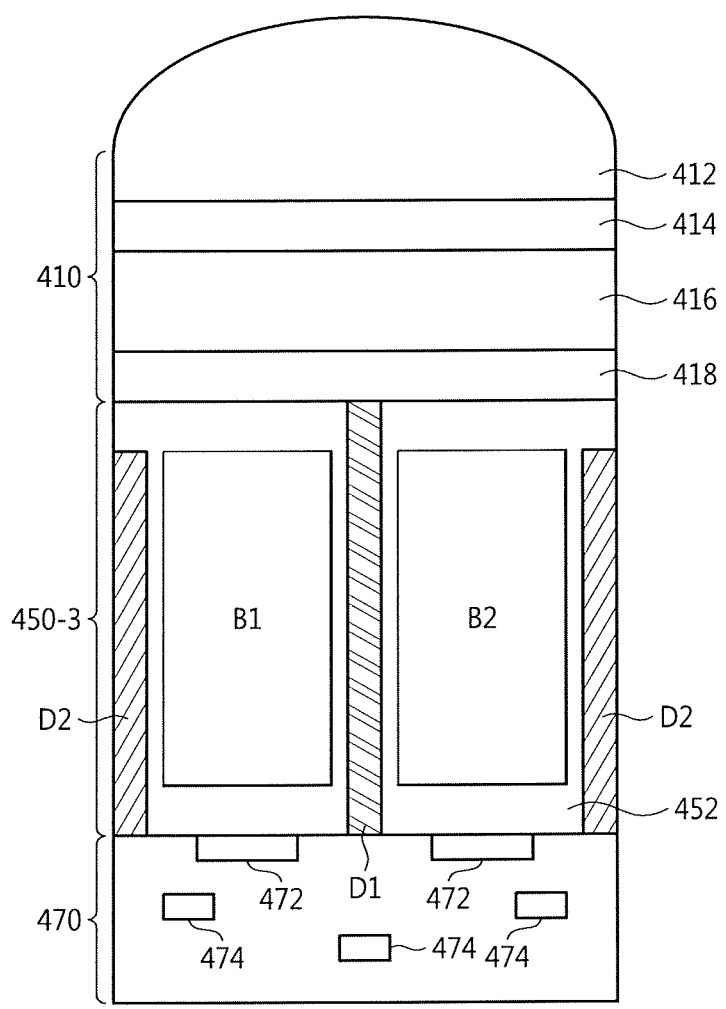

FIG. 9 shows a cross-section of a pixel 400-3 taken vertically along the line A-A' in FIG. 2, the line B-B' in FIG. 3, or the line C-C' in FIG. 4 according to an exemplary embodiment of the inventive concept. For convenience of explanation, only differences from the pixel 400-1 illustrated in FIG. 7 will be described herein.

The second trench D2 included in the pixel 400-3 may be formed along a portion of the full vertical length of a semiconductor substrate 450-3 rather than being formed along the entirety of the vertical length of the semiconductor substrate 450-3. When the second trench D2 is formed along a portion of the full vertical length of the semiconductor substrate 450-3, a ratio of the vertical length of the second trench D2 to the vertical length of the semiconductor substrate 450-3 is greater than 0 (e.g., a case in which the second trench D2 does not exist) and less than 1 (e.g., a case in which the vertical length of the second trench D2 is substantially the same as the vertical length of the semiconductor substrate 450-3). The second trench D2 may be formed using, for example, the front trench process.

Figure 10:
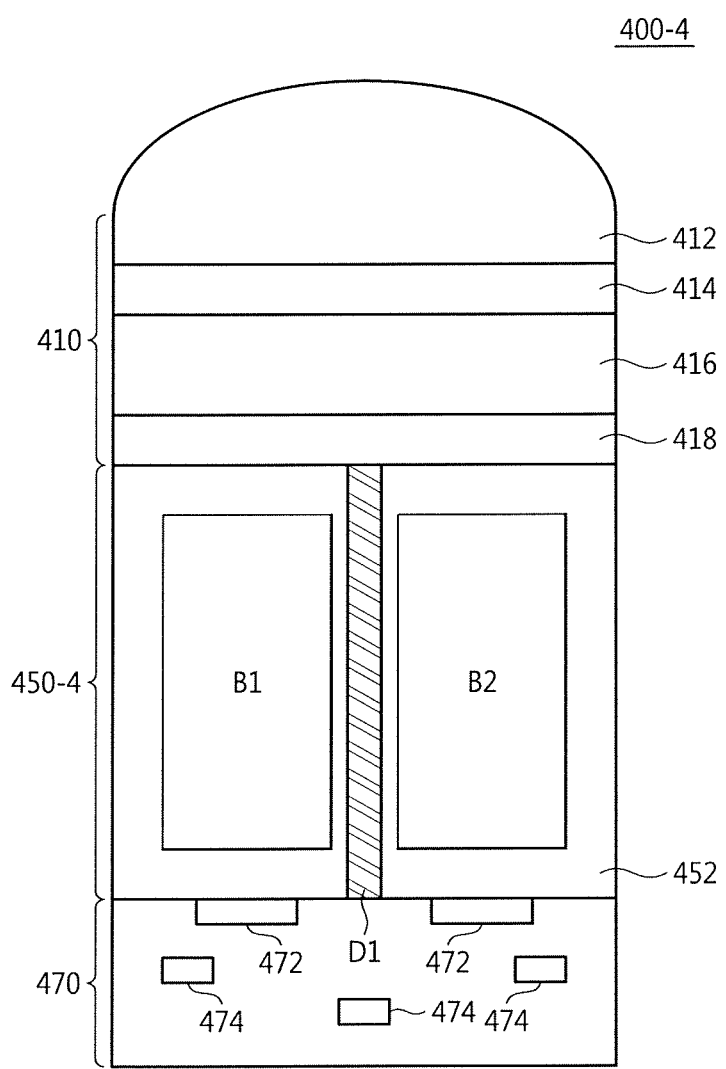

FIG. 10 shows a cross-section of a pixel 400-4 taken vertically along the line A-A' in FIG. 2, the line B-B' in FIG. 3, or the line C-C' in FIG. 4 according to an exemplary embodiment of the inventive concept. For convenience of explanation, only differences from the pixel 400-1 illustrated in FIG. 7 will be described herein.

Unlike the pixels 400-1 through 400-3 as previously described, a semiconductor substrate 450-4 in the pixel 400-4 does not include the second trench D2.

Figure 11:
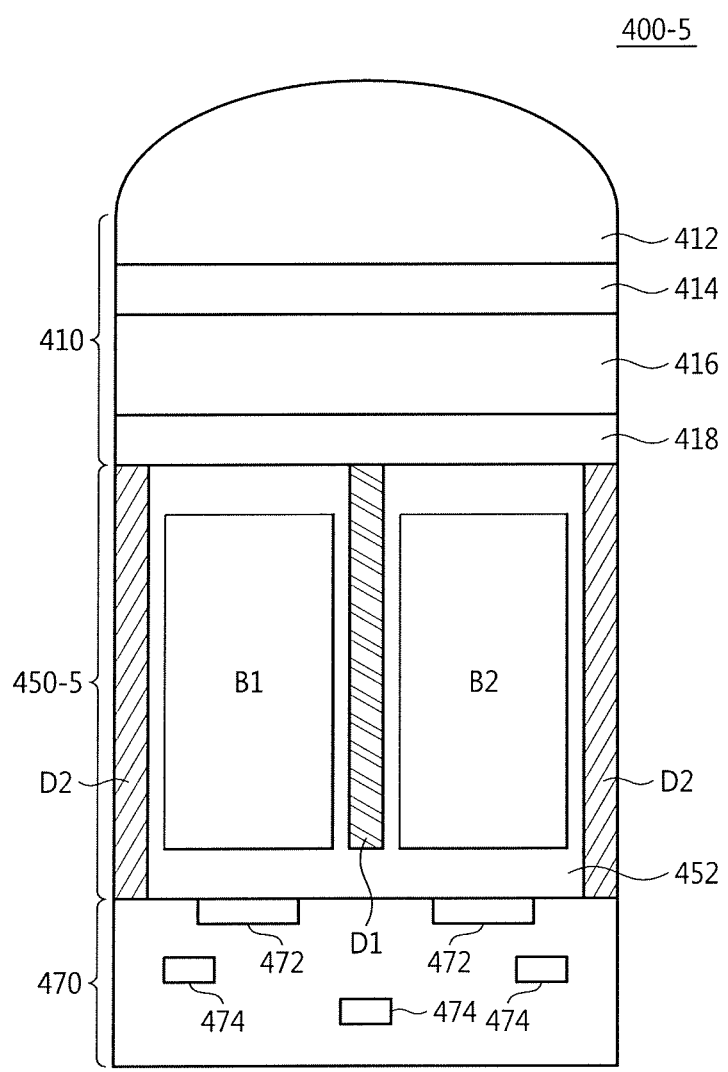

FIG. 11 shows a cross-section of a pixel 400-5 taken vertically along the line A-A' in FIG. 2, the line B-B' in FIG. 3, or the line C-C' in FIG. 4 according to an exemplary embodiment of the inventive concept. For convenience of explanation, only differences from the pixel 400-1 illustrated in FIG. 7 will be described herein.

The first trench D1 included in the pixel 400-5 may be formed along a portion of the full vertical length of a semiconductor substrate 450-5 rather than being formed along the entirety of the vertical length of the semiconductor substrate 450-5. When the first trench D1 is formed along a portion of the full vertical length of the semiconductor substrate 450-5, a ratio of the vertical length of the first trench D1 to the length of the semiconductor substrate 450-5 is greater than 0 (e.g., a case in which the first trench D1 does not exist) and less than 1 (e.g., a case in which the vertical length of the first trench D1 is substantially the same as the vertical length of the semiconductor substrate 450-5). The first trench D1 may be formed using, for example, the back trench process.

Figure 12:
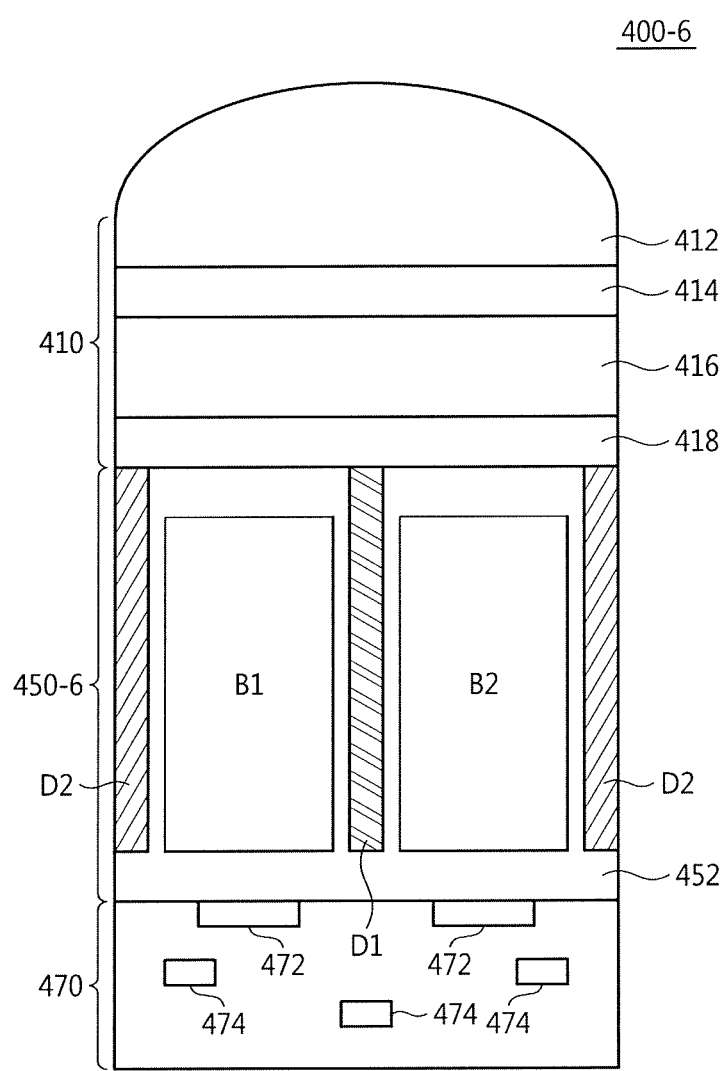
Figure 13:
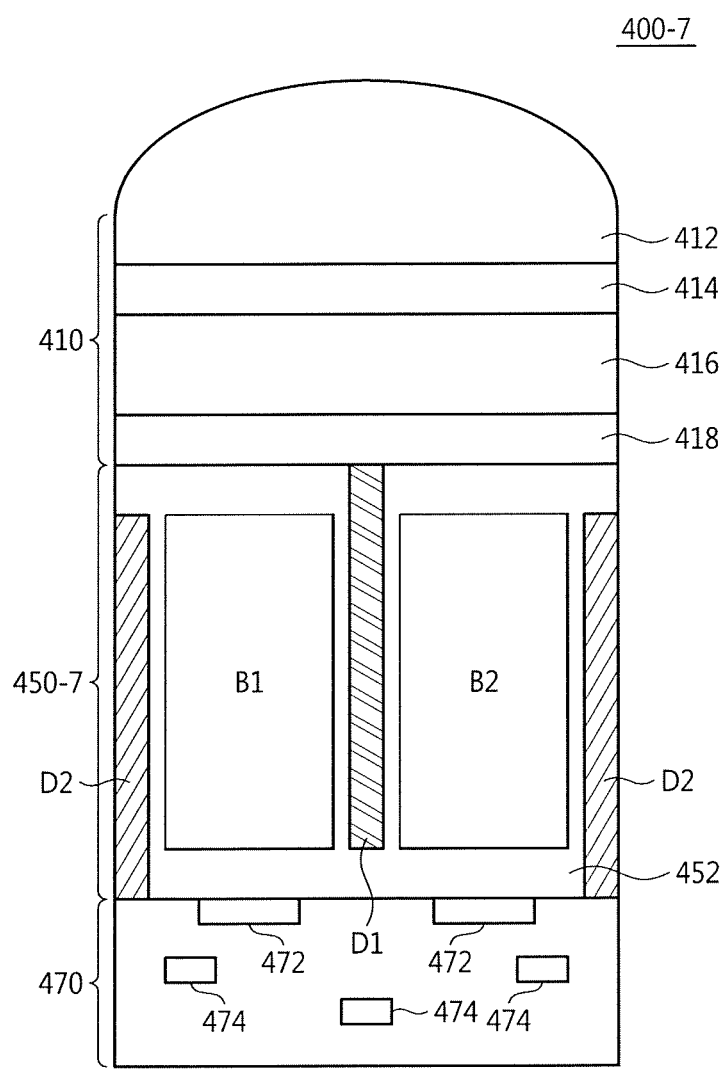
Figure 14:
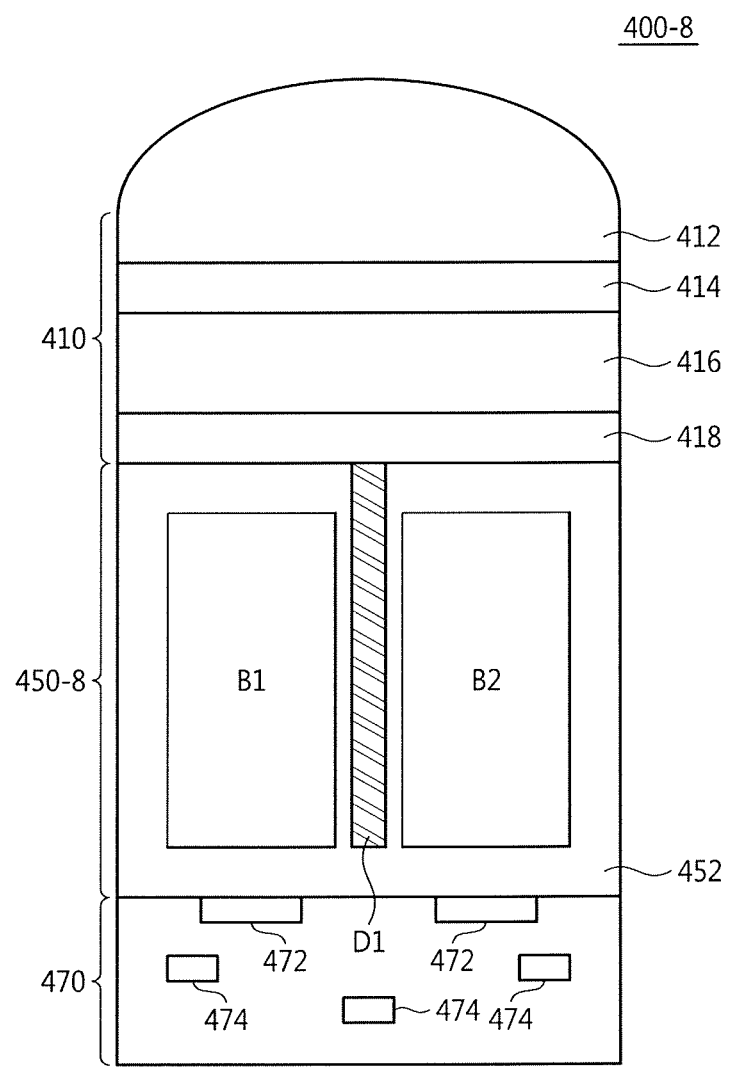

FIGS. 12 through 14 show cross-sections of pixels 400-6, 400-7, and 400-8 taken vertically along the line A-A' in FIG. 2, the line B-B' in FIG. 3, or the line C-C' in FIG. 4 according to exemplary embodiments of the inventive concept. For convenience of explanation, only differences from the pixel 400-5 illustrated in FIG. 11 will be described herein.

The configuration of the second trench D2 in the semiconductor substrate 450-6 of FIG. 12 is the same as the configuration of the second trench D2 in the semiconductor substrate 450-2 of FIG. 8 as described with reference to FIG. 8. For example, in this configuration, the second trench D2 is formed along a portion of the vertical length of the semiconductor substrates 450-6 and 450-2 (rather than along the entirety of the vertical length) starting at an upper portion of the semiconductor substrates 450-6 and 450-2 and extending downward. The configuration of the second trench D2 in the semiconductor substrate 450-7 of FIG. 13 is the same as the configuration of the second trench D2 in the semiconductor substrate 450-3 of FIG. 9 as described with reference to FIG. 9. For example, in this configuration, the second trench D2 is formed along a portion of the vertical length of the semiconductor substrates 450-7 and 450-3 (rather than along the entirety of the vertical length) starting at a lower portion of the semiconductor substrates 450-7 and 450-3 and extending upward. The configuration of the second trench D2 in the semiconductor substrate 450-8 of FIG. 14 is the same as the configuration of the second trench D2 in the semiconductor substrate 450-4 of FIG. 10 as described with reference to FIG. 10. For example, in this configuration, the second trench D2 is not included.

Figure 15:
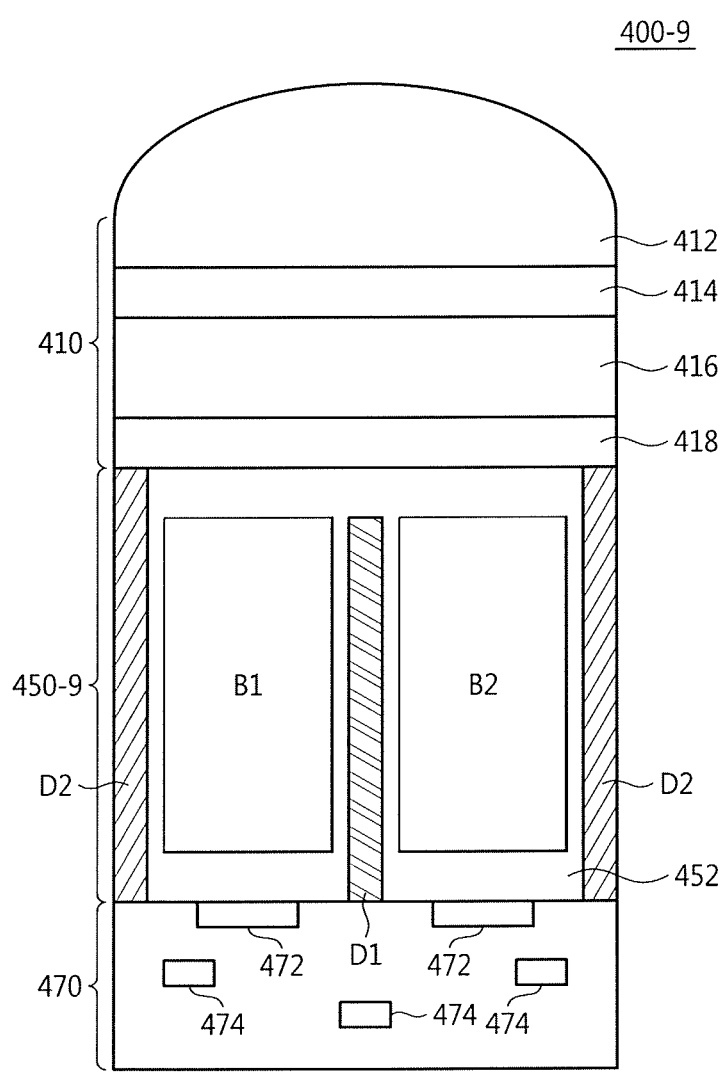

FIG. 15 shows a cross-section of a pixel 400-9 taken vertically along the line A-A' in FIG. 2, the line B-B' in FIG. 3, or the line C-C' in FIG. 4 according to an exemplary embodiment of the inventive concept. For convenience of explanation, only differences from the pixel 400-1 illustrated in FIG. 7 will be described herein.

The first trench D1 included in the pixel 400-9 may be formed along a portion of the full vertical length of a semiconductor substrate 450-9 rather than being formed along the entirety of the vertical length of the semiconductor substrate 450-9. When the first trench D1 is formed along a portion of the full vertical length of the semiconductor substrate 450-9, a ratio of the vertical length of the first trench D1 to the vertical length of the semiconductor substrate 450-9 is greater than 0 (e.g., a case in which the first trench D1 does not exist) and less than 1 (e.g., a case in which the vertical length of the first trench D1 is substantially the same as the vertical length of the semiconductor substrate 450-9). The first trench D1 may be formed using, for example, the front trench process.

Figure 16:
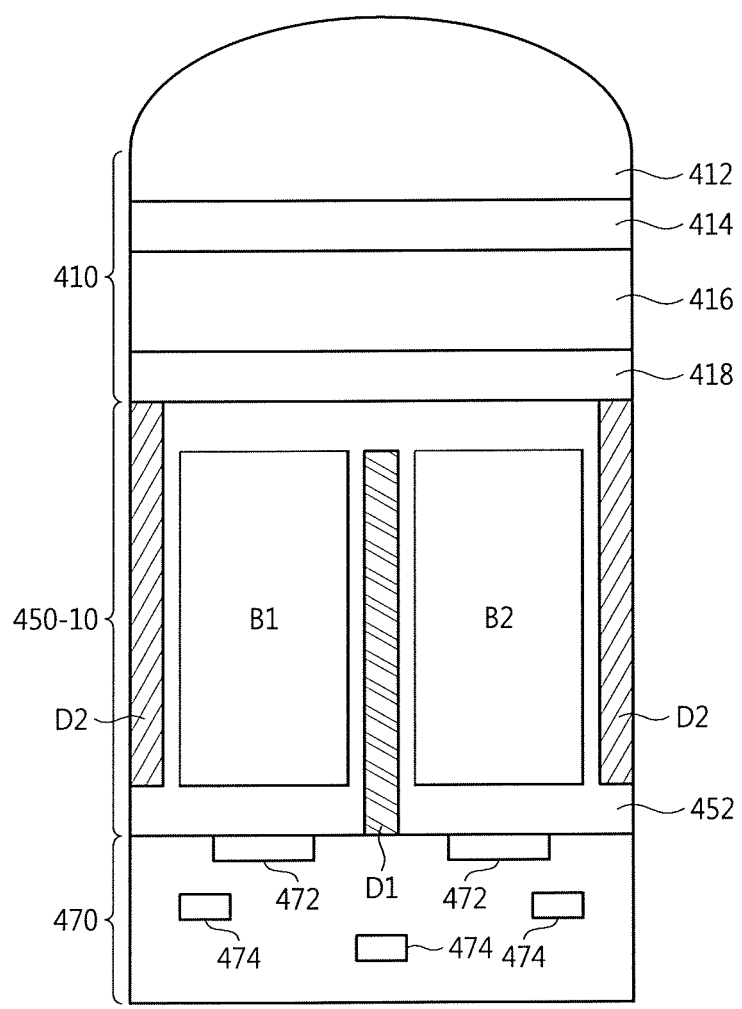
Figure 17:
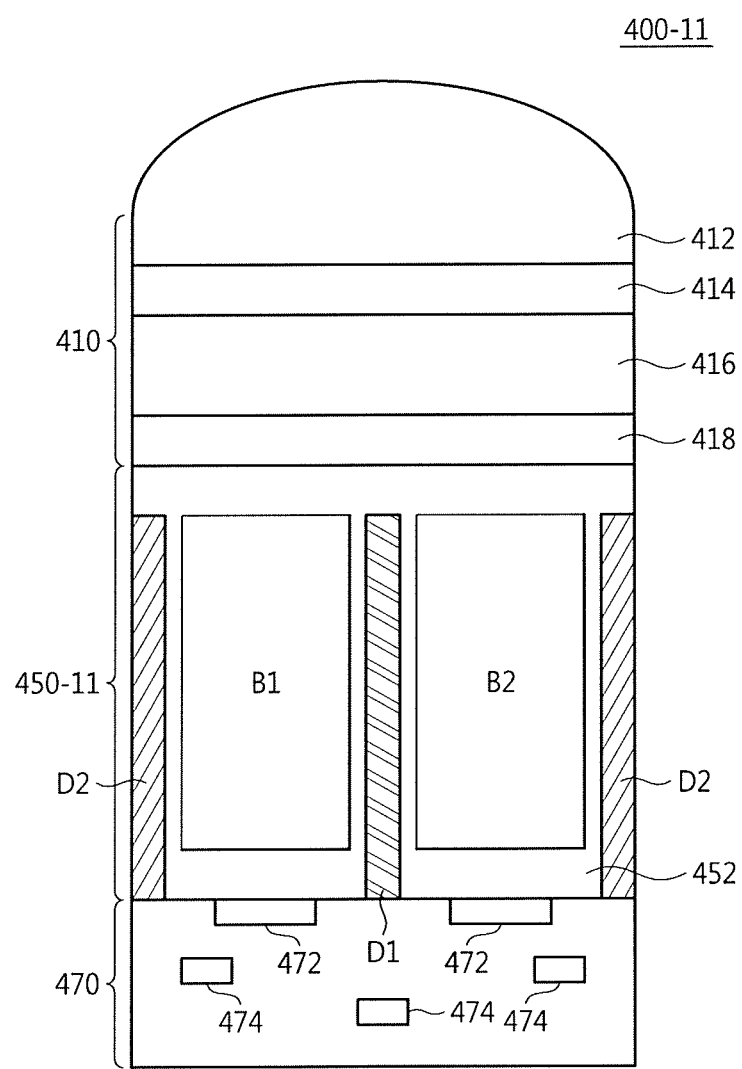
Figure 18:
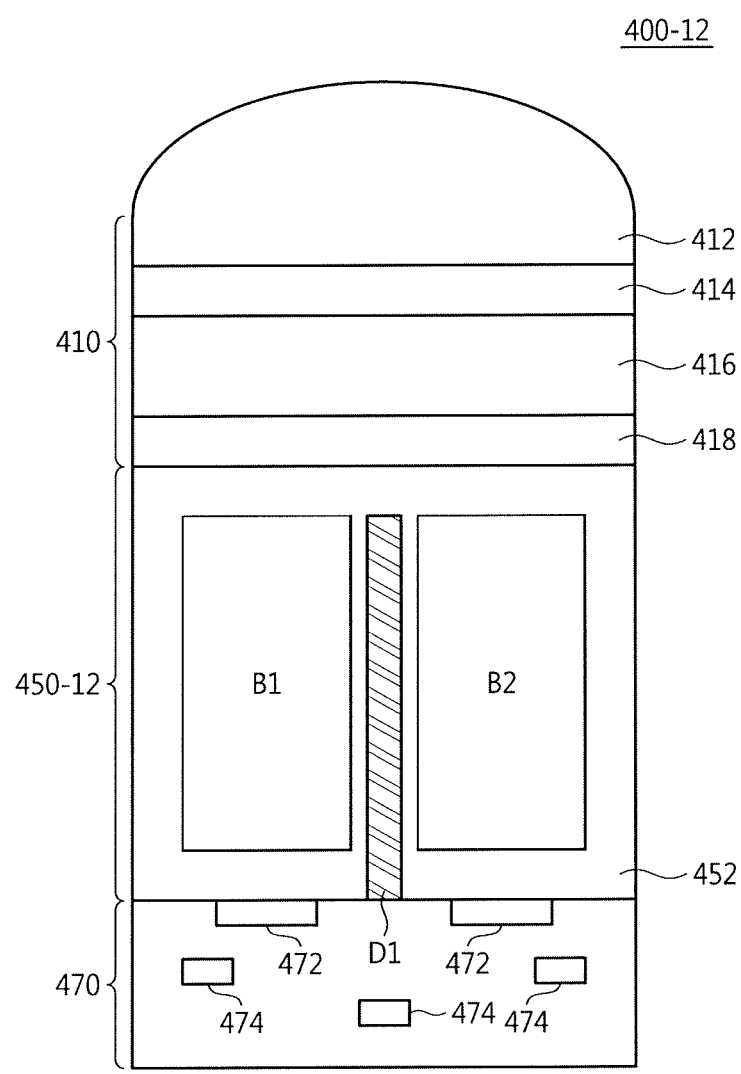

FIGS. 16 through 18 show cross-sections of pixels 400-10, 400-11, and 400-12 taken vertically along the line A-A' in FIG. 2, the line B-B' in FIG. 3, or the line C-C' in FIG. 4 according to exemplary embodiments of the inventive concept. For convenience of explanation, only differences from the pixel 400-9 illustrated in FIG. 15 will be described herein.

The configuration of the second trench D2 in the semiconductor substrate 450-10 of FIG. 16 is the same as the configuration of the second trench D2 in the semiconductor substrate 450-2 of FIG. 8 as described with reference to FIG. 8. For example, in this configuration, the second trench D2 is formed along a portion of the vertical length of the semiconductor substrates 450-10 and 450-2 (rather than along the entirety of the vertical length) starting at an upper portion of the semiconductor substrates 450-10 and 450-2 and extending downward. The configuration of the second trench D2 in the semiconductor substrate 450-11 of FIG. 17 is the same as the configuration of the second trench D2 in the semiconductor substrate 450-3 of FIG. 9 as described with reference to FIG. 9. For example, in this configuration, the second trench D2 is formed along a portion of the vertical length of the semiconductor substrates 450-11 and 450-3 (rather than along the entirety of the vertical length) starting at a lower portion of the semiconductor substrates 450-11 and 450-3 and extending upward. The configuration of the second trench D2 in the semiconductor substrate 450-12 of FIG. 18 is the same as the configuration of the second trench D2 in the semiconductor substrate 450-4 of FIG. 10 as described with reference to FIG. 10. For example, in this configuration, the second trench D2 is not included.

Figure 19:
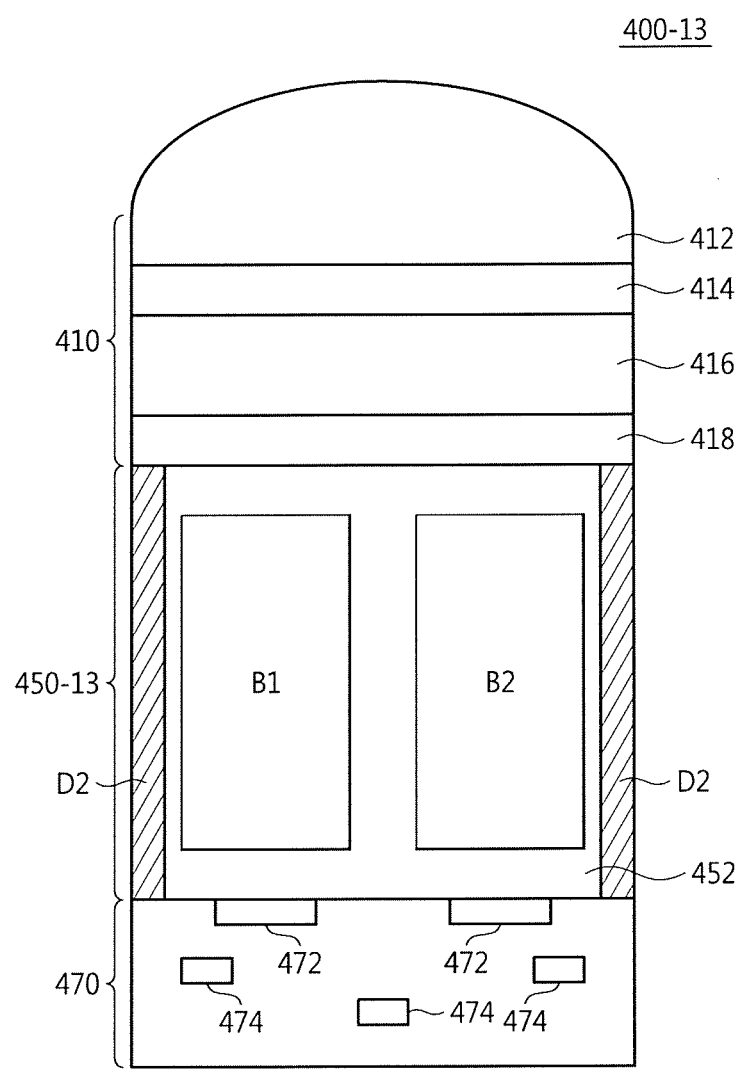

FIG. 19 shows a cross-section of a pixel 400-13 taken vertically along the line A-A' in FIG. 2, the line B-B' in FIG. 3, or the line C-C' in FIG. 4 according to an exemplary embodiment of the inventive concept. For convenience of explanation, only differences from the pixel 400-1 illustrated in FIG. 7 will be described herein. For example, in FIG. 19, the pixel 400-13 does not include the first trench D1.

Figure 20:
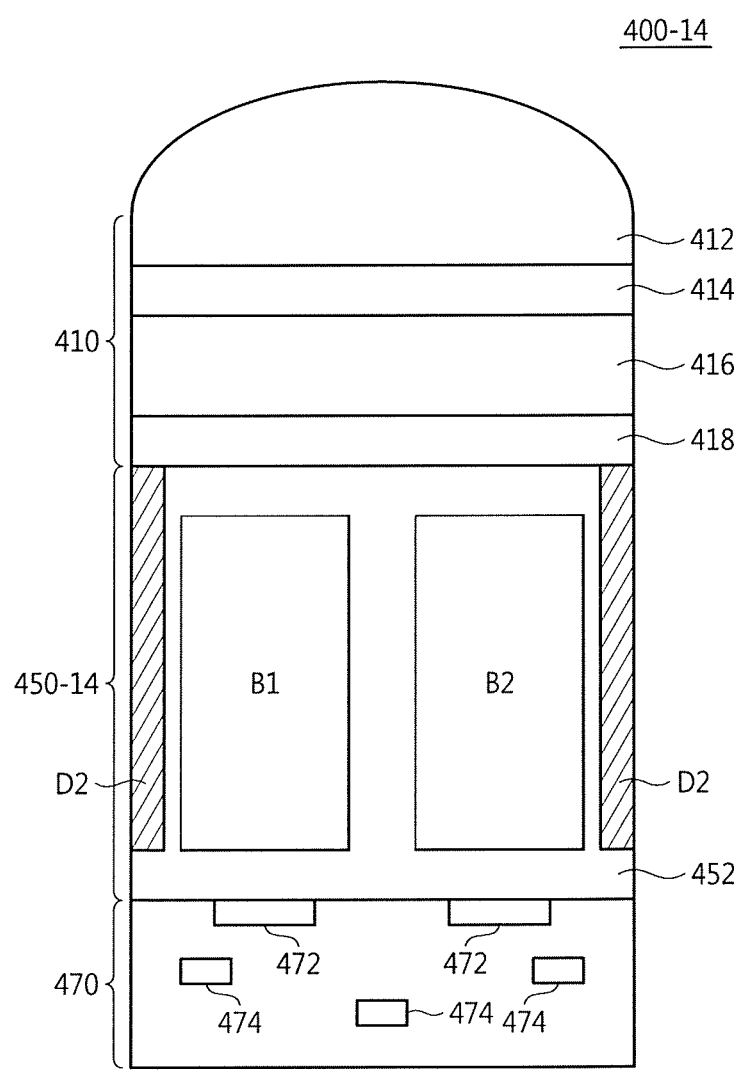
Figure 21:
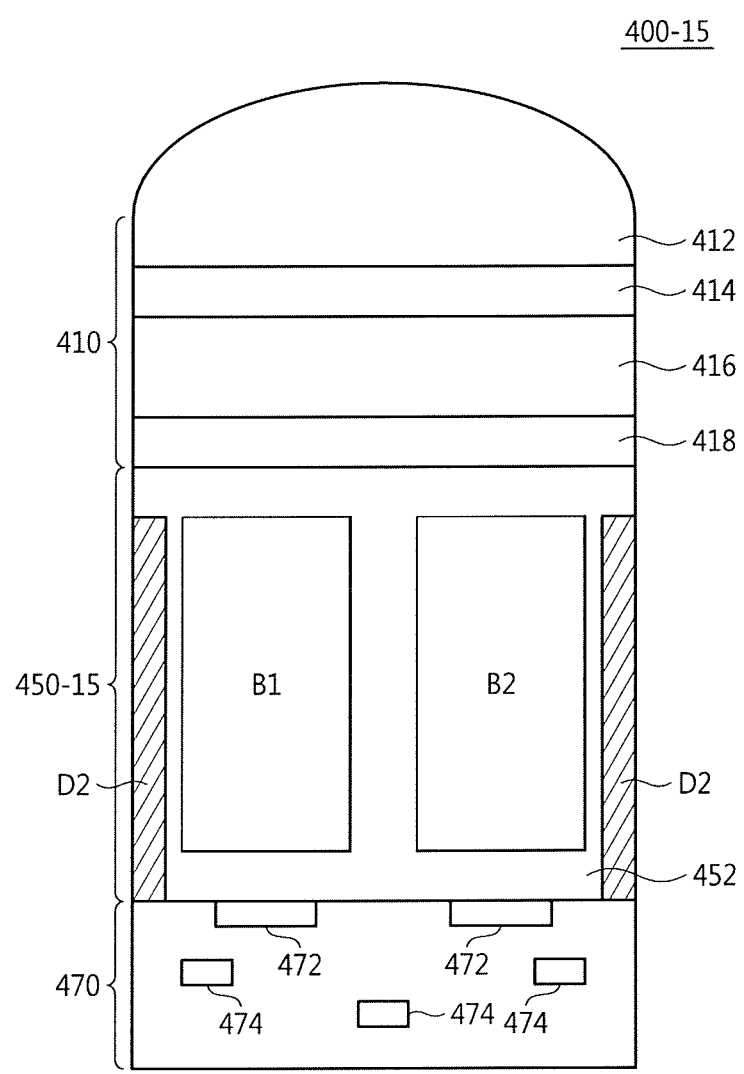

FIGS. 20 and 21 show cross-sections of pixels 400-14 and 400-15 taken vertically along the line A-A' in FIG. 2, the line B-B' in FIG. 3, or the line C-C' in FIG. 4 according exemplary embodiments of the inventive concept. For convenience of explanation, only differences from the pixel 400-13 illustrated in FIG. 19 will be described herein.

The configuration of the second trench D2 in the semiconductor substrate 450-14 of FIG. 20 is the same as the configuration of the second trench D2 in the semiconductor substrate 450-2 of FIG. 8 as described with reference to FIG. 8. For example, in this configuration, the second trench D2 is formed along a portion of the vertical length of the semiconductor substrates 450-14 and 450-2 (rather than along the entirety of the vertical length) starting at an upper portion of the semiconductor substrates 450-14 and 450-2 and extending downward. The configuration of the second trench D2 in the semiconductor substrate 450-15 of FIG. 21 is the same as the configuration of the second trench D2 in the semiconductor substrate 450-3 of FIG. 9 as described with reference to FIG. 9. For example, in this configuration, the second trench D2 is formed along a portion of the vertical length of the semiconductor substrates 450-15 and 450-3 (rather than along the entirety of the vertical length) starting at a lower portion of the semiconductor substrates 450-15 and 450-3 and extending upward.

Figure 22:
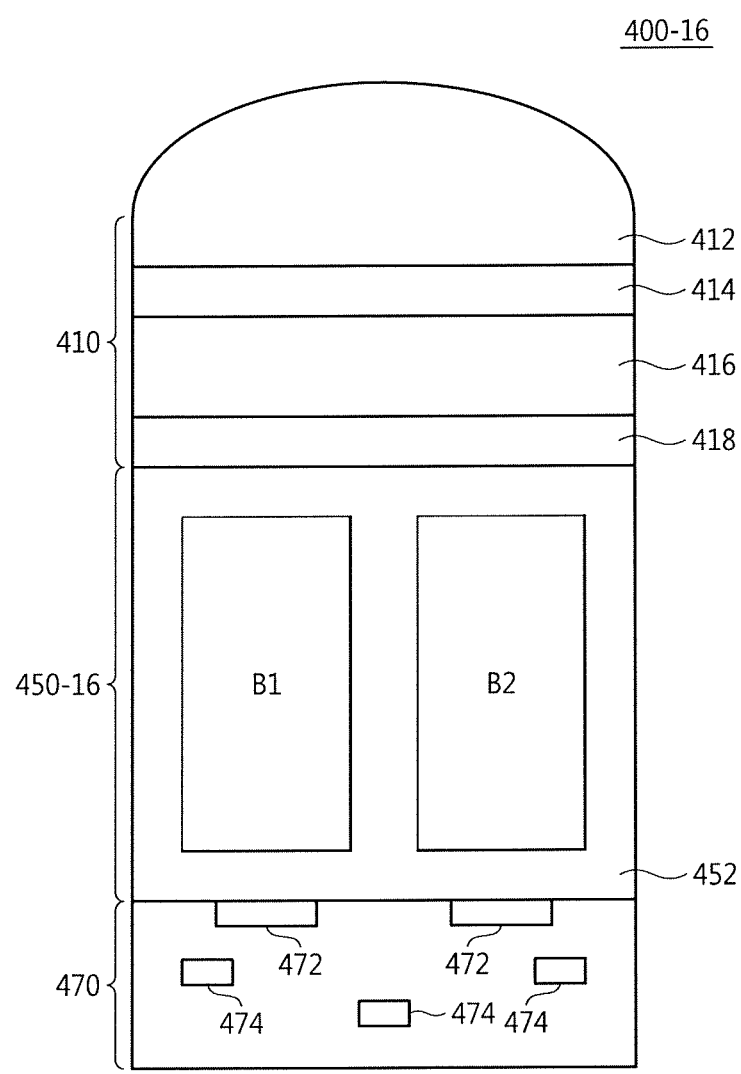
FIG. 22 is a diagram of a cross-section of a first pixel in a comparative example of the inventive concept.

FIG. 22 is a diagram of a cross-section of a first pixel 400-16 in a comparative example of the inventive concept. Referring to FIGS. 1 through 22, the semiconductor substrate 450-16 of the pixel 400-16 may not include either the first trench D1 or the second trench D2. As a result, electrical crosstalk and/or optical crosstalk occurring between adjacent photodiodes (e.g., B2 and B1 or B2 and Gb1) may increase. Thus, the SNR of subpixel signals generated by the pixel 400-16 may be high, resulting in decreased quality of displayed images and inaccurate autofocusing.

As described above, the image sensor 100 according to exemplary embodiments of the inventive concept includes the first trench D1 and/or the second trench D2. Inclusion of the first trench D1 and/or the second trench D2 may prevent or reduce electrical crosstalk and optical crosstalk occurring between adjacent photodiodes (e.g., B2 and B1 or B2 and Gb 1), thereby increasing the quality of images.

Figure 23:
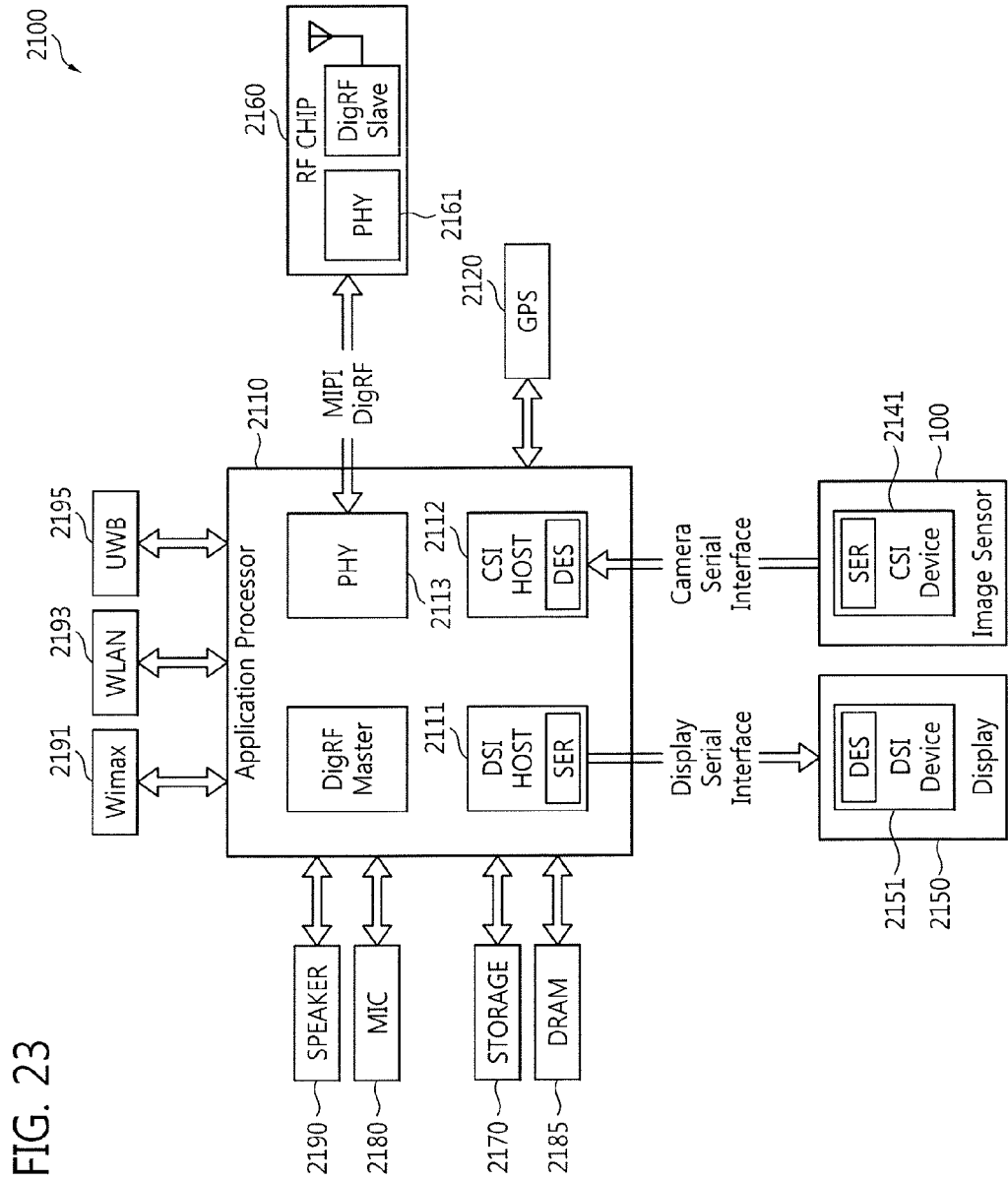
FIG. 23 is a block diagram of an electronic system including an image sensor according to exemplary embodiments of the inventive concept.

FIG. 23 is a block diagram of an electronic system including an image sensor according to exemplary embodiments of the inventive concept. Referring to FIGS. 1 and 23, the electronic system 2100 may be implemented by a data processing apparatus such as, for example, a mobile phone, a personal digital assistant (PDA), a portable media player (PMP), an internet protocol television (IP TV), or a smartphone that can use or support the MIPI interface. The electronic system 2100 includes the image sensor 100, an application processor 2110, and a display 2150.

A camera serial interface (CSI) host 2112 included in the application processor 2110 performs serial communication with a CSI device 2141 included in the image sensor 100 through CSI. For example, an optical de-serializer (DES) may be implemented in the CSI host 2112, and an optical serializer (SER) may be implemented in the CSI device 2141.

A display serial interface (DSI) host 2111 included in the application processor 2110 performs serial communication with a DSI device 2151 included in the display 2150 through DSI. For example, an optical serializer may be implemented in the DSI host 2111, and an optical de-serializer may be implemented in the DSI device 2151.

The electronic system 2100 may also include a radio frequency (RF) chip 2160 which communicates with the application processor 2110. A physical layer (PHY) 2113 of the electronic system 2100 and a PHY 2161 of the RF chip 2160 communicate data with each other according to a MIPI DigRF standard. The electronic system 2100 may further include at least one element from among a GPS radio 2120, a storage device 2170, a microphone 2180, a DRAM 2185 and a speaker 2190. The electronic system 2100 may communicate using a communication standard such as, for example, Wimax (World Interoperability for Microwave Access) 2191, WLAN (Wireless LAN) 2193, UWB (Ultra Wideband) 2195 etc.

Figure 24:
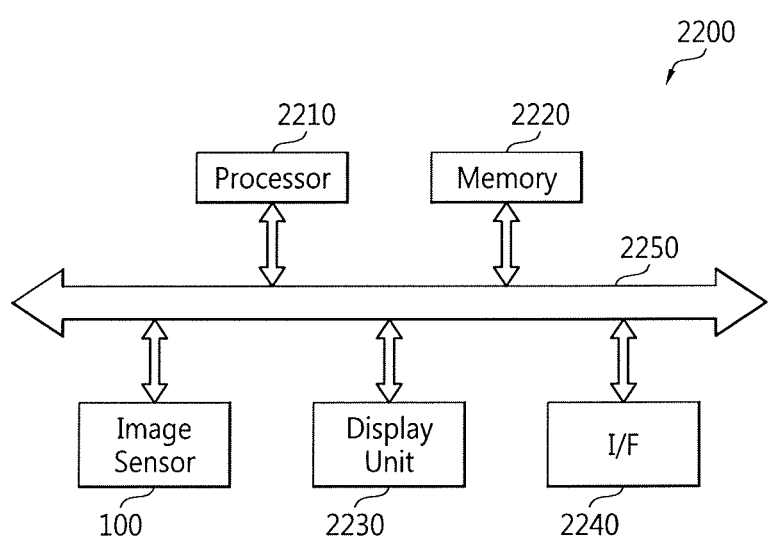
FIG. 24 is a block diagram of an electronic system including the image sensor illustrated in FIG. 1 according to an exemplary embodiment of the inventive concept.

FIG. 24 is a block diagram of an electronic system including the image sensor illustrated in FIG. 1 according to an exemplary embodiment of the inventive concept. Referring to FIGS. 1 and 24, the electronic system 2200 includes the image sensor 100, a processor 2210, a memory 2220, a display unit 2230 and an interface 2240 connected to one another via a bus 2250.

The processor 2210 may control the operation of the image sensor 100. For example, the processor 2210 may process pixel signals output from the image sensor 100 and may generate image data.

The memory 2220 may store a program(s) for controlling the image sensor 100 and the image data generated by the processor 2210. The processor 2210 may execute the program stored in the memory 2220. The memory 2220 may be implemented using, for example, a volatile or a non-volatile memory.

The display unit 2230 may display the image data output from the processor 2210 or the memory 2220. The display unit 2230 may be, for example, a liquid crystal display (LCD), a light emitting diode (LED) display, an organic LED (OLED) display, an active matrix organic light emitting diodes (AMOLED) display, a flexible display, etc.

The interface 2240 may be implemented as an interface for inputting and outputting the image data. For example, the interface 2240 may be implemented by a wireless interface or a wired interface.

Exemplary embodiments of the inventive concept may also be embodied as a computer-readable code disposed on a computer-readable recording medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network-coupled computer systems so that the computer-readable code is stored and executed in a distributed fashion. Further, functional programs, codes, and code segments that implement exemplary embodiments of the present inventive concept may be implemented by programmers.

As described above, according to exemplary embodiments of the inventive concept, an image pixel includes at least one trench, which results in the prevention or reduction of electrical crosstalk and/or optical crosstalk between adjacent photodiodes, thereby increasing the quality of images in an image sensor and image processing system including the image pixel.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. An image pixel, comprising
  a plurality of photodiodes formed in a semiconductor substrate, wherein each photodiode is configured to accumulate a plurality of photocharges corresponding to an intensity of light received at each photodiode through a microlens; and
  a plurality of trenches configured to electrically isolate the photodiodes from one another,
  wherein at least one of the plurality of trenches extends from an upper surface of the semiconductor substrate to a lower surface of the semiconductor substratein a cross-sectional view.

2. The image pixel of claim 1, further comprising:
  a wiring layer formed on the lower surface of the semiconductor substrate,
  wherein the microlens is disposed on the upper surface of the semiconductor substrate that opposes the lower surface, and the photodiodes are disposed between the wiring layer and the microlens,
  wherein an operation is performed on a plurality of pixel signals generated by the photodiodes to obtain information relating to an autofocusing operation.

3. The image pixel of claim 1, wherein each trench comprises:
  a deep trench isolation (DTI) trench formed using a DTI process,
  wherein each DTI trench is configured to electrically isolate adjacent photodiodes from among the plurality of photodiodes from each other.

4. The image pixel of claim 3, wherein at least one of the DTI trenches is formed along an entirety of a vertical length of the semiconductor substrate.

5. The image pixel of claim 3, wherein at least one of the DTI trenches is formed along a portion of a vertical length of the semiconductor substrate, wherein the portion of the vertical length is less than an entirety of the vertical length.

6. The image pixel of claim 3, wherein the DTI trenches are formed using a back trench process.

7. The image pixel of claim 3, wherein the DTI trenches are formed using a front trench process.

8. The image pixel of claim 1, wherein each trench comprises;
  a deep trench isolation (DTI) trench formed using a DTI process,
  wherein at least one of the DTI trenches is configured to electrically isolate the plurality of photodiodes formed in the image pixel from a photodiode formed in an adjacent image pixel.

9. The image pixel of claim 8, wherein, at least one of the DTI trenches is formed along an entirety of a vertical length of the semiconductor substrate.

10. The image pixel of claim 8, wherein at least one of the DTI trenches is formed along a portion of a vertical length of the semiconductor substrate, wherein the portion of the vertical length is less than an entirety of the vertical length.

11. The image pixel of claim 8, wherein the DTI trenches are formed using a back trench process.

12. The image pixel of claim 8, wherein the DTI trenches are formed using a front trench process.

13. An image sensor, comprising:
  a pixel array comprising a plurality of image pixels, wherein each image pixel comprises:
  a plurality of photodiodes formed in a semiconductor substrate, wherein each photodiode is configured to accumulate a plurality of photocharges corresponding to an intensity of light received at each photodiode through a microlens; and
  a plurality of trenches configured to electrically isolate the photodiodes from one another,
  wherein at least one of the plurality of trenches has a different depth from another one of the plurality of trenches.

14. The image sensor of claim 13, further comprising:
  a wiring layer formed on a first surface of the semiconductor substrate,
  wherein the microlens is disposed on a second surface of the semiconductor substrate that opposes the first surface, and the photodiodes are disposed between the wiring layer and the microlens,
  wherein an operation is performed on a plurality of pixel signals generated by the photodiodes to obtain information relating to an autofocusing operation.

15. The image sensor of claim 13, wherein the trenches comprise:
  a first deep trench isolation (DTI) trench formed using a DTI process and configured to electrically isolate adjacent photodiodes from among the plurality of photodiodes from each other; and
  a second DTI trench formed using a DTI process and configured to electrically isolate the plurality of photodiodes formed in the image pixel from a photodiode formed in an adjacent image pixel.

16. The image sensor of claim 15, wherein each of the first DTI trench and the second DTI trench is formed along an entirety of a vertical length of the semiconductor substrate, or along a portion of the vertical length of the semiconductor substrate that is less than the entirety of the vertical length.

17. The image sensor of claim 15, wherein each of the first DTI trench and the second DTI trench is formed using one of a back trench process and a front trench process.

18. An image pixel, comprising:
- a plurality of photodiodes formed in a semiconductor substrate, wherein each photodiode is configured to accumulate a plurality of photocharges corresponding to an intensity of light received at each photodiode through a microlens;
- a first trench configured to electrically isolate adjacent photodiodes from among the plurality of photodiodes from each other;
- a second trench configured to electrically isolate the plurality of photodiodes formed in the image pixel from a photodiode formed in a first adjacent image pixel disposed adjacent to a first side of the image pixel; and
- a third configured to electrically isolate the polarity of photodiodes formed in the image pixel from a photodiode formed in a second adjacent image pixel disposed adjacent to a second side of the image pixel that opposes the first side,
- wherein the first trench extends from an uppermost surface of the semiconductor substrate to a lowermost surface of the semiconductor substrate in a vertical direction,
- wherein second and third trenches extend from the uppermost surface and do not fully extend to the lowermost surface in the vertical direction, or extend from the lowermost surface and do not fully extend to the uppermost surface in the vertical direction.

\* \* \* \* \*